US009399815B2

(12) United States Patent
Kuramochi et al.

(10) Patent No.: US 9,399,815 B2
(45) Date of Patent: Jul. 26, 2016

(54) SINTERED OXIDE MATERIAL, METHOD FOR MANUFACTURING SAME, SPUTTERING TARGET, OXIDE TRANSPARENT ELECTRICALLY CONDUCTIVE FILM, METHOD FOR MANUFACTURING SAME, AND SOLAR CELL

(75) Inventors: Hideto Kuramochi, Ayase (JP); Keitaro Matsumaru, Ayase (JP); Ryo Akiike, Ayase (JP); Kentaro Utsumi, Ayase (JP); Tetsuo Shibutami, Ayase (JP)

(73) Assignee: TOSOH CORPORATION, Yamaguchi (JP)

( * ) Notice: Subject to any disclaimer, the term of this patent is extended or adjusted under 35 U.S.C. 154(b) by 456 days.

(21) Appl. No.: 13/876,278

(22) PCT Filed: Sep. 27, 2011

(86) PCT No.: PCT/JP2011/072091
§ 371 (c)(1),
(2), (4) Date: Jun. 17, 2013

(87) PCT Pub. No.: WO2012/043570
PCT Pub. Date: Apr. 5, 2012

(65) Prior Publication Data
US 2013/0276879 A1    Oct. 24, 2013

(30) Foreign Application Priority Data

Sep. 29, 2010  (JP) ................................. 2010-218535
Dec. 8, 2010   (JP) ................................. 2010-273490

(51) Int. Cl.
*C23C 14/08*    (2006.01)
*C23C 14/34*    (2006.01)
(Continued)

(52) U.S. Cl.
CPC .............. *C23C 14/08* (2013.01); *C01G 19/006* (2013.01); *C04B 35/01* (2013.01); *C04B 35/457* (2013.01);
(Continued)

(58) Field of Classification Search
None
See application file for complete search history.

(56) References Cited

U.S. PATENT DOCUMENTS

2003/0218153 A1* 11/2003 Abe ........................ C23C 14/08
                                                     252/500
2005/0239660 A1* 10/2005 Abe ........................ C04B 35/01
                                                     505/475
2011/0011731 A1    1/2011 Takahashi et al.

FOREIGN PATENT DOCUMENTS

AU    2008352028    9/2009
CN    101981685    2/2011
(Continued)

OTHER PUBLICATIONS

Bixbite: Red Beryl [http://www.gemselect.com/other-info/bixbite-red-beryl.php, retrieved on Sep. 10, 2015].*
(Continued)

*Primary Examiner* — Tamir Ayad
*Assistant Examiner* — Eric R Smith
(74) *Attorney, Agent, or Firm* — Greenblum & Bernstein, P.L.C.

(57) ABSTRACT

The invention provides an oxide sintered compact 2 composed of a crystal phase which consists of a bixbite-type oxide phase and a perovskite-type oxide phase, or a bixbite-type oxide phase, the crystal phase having indium, tin, strontium and oxygen as the constituent elements, and the indium, the tin and the strontium contents satisfying formulas (1) and (2) in terms of atomic ratio, as well as a sputtering target. There are further provided an oxide transparent conductive film formed using the sputtering target, and a solar cell.

$$Sn/(In+Sn+Sr)=0.01-0.11 \quad (1)$$

$$Sr/(In+Sn+Sr)=0.0005-0.004 \quad (2)$$

[In formulas (1) and (2), In, Sn and Sr represent indium, tin and strontium contents (atomic percent), respectively.]

7 Claims, 2 Drawing Sheets

(51) Int. Cl.
  *C23C 14/35* (2006.01)
  *C01G 19/00* (2006.01)
  *C04B 35/01* (2006.01)
  *C04B 35/457* (2006.01)
  *H01B 1/08* (2006.01)
  *H01L 31/0224* (2006.01)
  *H01L 31/0749* (2012.01)
  *H01L 31/18* (2006.01)
  *C04B 35/626* (2006.01)
  *C04B 35/645* (2006.01)

(52) U.S. Cl.
  CPC ..... *C04B 35/62635* (2013.01); *C04B 35/62675* (2013.01); *C04B 35/62685* (2013.01); *C04B 35/645* (2013.01); *C23C 14/086* (2013.01); *C23C 14/3407* (2013.01); *C23C 14/3414* (2013.01); *C23C 14/35* (2013.01); *H01B 1/08* (2013.01); *H01L 31/022425* (2013.01); *H01L 31/022466* (2013.01); *H01L 31/022475* (2013.01); *H01L 31/0749* (2013.01); *H01L 31/1884* (2013.01); *C01P 2002/34* (2013.01); *C01P 2002/50* (2013.01); *C01P 2004/62* (2013.01); *C01P 2006/40* (2013.01); *C01P 2006/60* (2013.01); *C04B 2235/3213* (2013.01); *C04B 2235/3286* (2013.01); *C04B 2235/3293* (2013.01); *C04B 2235/5409* (2013.01); *C04B 2235/5445* (2013.01); *C04B 2235/604* (2013.01); *C04B 2235/6562* (2013.01); *C04B 2235/6565* (2013.01); *C04B 2235/6585* (2013.01); *C04B 2235/6586* (2013.01); *C04B 2235/76* (2013.01); *C04B 2235/768* (2013.01); *C04B 2235/77* (2013.01); *C04B 2235/786* (2013.01); *C04B 2235/80* (2013.01); *C04B 2235/963* (2013.01); *Y02E 10/541* (2013.01); *Y02P 70/521* (2015.11)

(56) References Cited

FOREIGN PATENT DOCUMENTS

| CN | 101981699 | 2/2011 | |
| JP | 9-78236 | 3/1997 | |
| JP | 9-219530 | 8/1997 | |
| JP | 2002030429 A * | 1/2002 | |
| JP | 2003-105532 | 4/2003 | |
| JP | 2004-026554 | 1/2004 | |
| JP | 2005-302356 | 10/2005 | |
| JP | 2008/195554 | 8/2008 | |
| JP | 2010-030824 | 2/2010 | |
| TW | 200903810 | 1/2009 | |
| TW | 201023357 | 6/2010 | |
| WO | 2008/123420 | 10/2008 | |
| WO | 2009/044888 | 4/2009 | |
| WO | 2009/044896 | 4/2009 | |
| WO | WO2011116981 A1 * | 10/2010 | ............ C23C 14/086 |

OTHER PUBLICATIONS

Machine translation of WO2010/116981A1.*
Machine translation of JP2002-030429A.*
Taiwan Office action issued in TW 100135305, mail date is May 19, 2015.
Search report from E.P.O. in EP 11829123 6, mail date is Feb. 25, 2014.
Chinese Office Action in CN 201180057433.5, mailed Dec. 4, 2013.
Search report from International Application No. PCT/JP2011/072091, mail date is Dec. 20, 2011.
International Preliminary Report on Patentability PCT/JP2011/072091, mail date is Apr. 18, 2013.

* cited by examiner

SINTERED OXIDE MATERIAL, METHOD FOR MANUFACTURING SAME, SPUTTERING TARGET, OXIDE TRANSPARENT ELECTRICALLY CONDUCTIVE FILM, METHOD FOR MANUFACTURING SAME, AND SOLAR CELL

TECHNICAL FIELD

The present invention relates to an oxide sintered compact, to a method for manufacturing the same, to a sputtering target, to an oxide transparent conductive film, to a method for manufacturing the same, and to a solar cell.

BACKGROUND ART

Oxide transparent conductive films have low resistance and high transmittance in the visible light region, and are used as display devices such as liquid crystals, and light receiving elements such as solar cells. Among oxide transparent conductive films, indium oxide films are widely used as tin-added ITO films or zinc-added IZO films.

When utilizing an oxide transparent conductive film for a solar cell, where it is important to have optical transparency across a wide wavelength range, it is desirable to further improve the optical transparency not only in the visible light region but also in the infrared region. While measures have been taken to reduce tin content of ITO films in order to satisfy this need, this strategy has tended to result in lower reliability.

ITiO films that have titanium added instead of tin can improve optical transparency in the infrared region, but their reliability is inadequate. It has therefore been desirable to obtain both higher optical transparency in the infrared region and higher reliability.

PTL 1 discloses a high-resistance indium oxide-based transparent conductive film with tin and an insulator added, having a resistivity of about 0.8 to $10 \times 10^{-3}$ Ωcm. Although strontium is mentioned as an example of the insulator, no disclosure thereof is provided in the examples, and absolutely nothing is mentioned regarding the composition and characteristics.

Also, PTL 2 discloses an indium oxide-based transparent conductive film with addition of tin and strontium. It is stated therein that an amorphous film can be easily obtained and that the amorphous film can be easily patterned by weak acid etching, and also that the readily crystallized film has low resistance and high transmittance. However, nothing is mentioned regarding optical transparency in the infrared region or reliability, which are important for use in solar cells where optical transparency is important. With sputtering targets used for such film formation, minimizing generation of anomalous discharge during the sputtering helps minimize the reduction in yield caused by particle fly-off, and contributes to productivity. While this is considered to be a very important issue, no disclosure is provided regarding anomalous discharge during sputtering.

Specifically, with a conventional sputtering target to be used for film formation, it has been difficult to adequately reduce generation of anomalous discharge during sputtering. This results in the problem of reduction in yield due to particle fly-off during anomalous discharge, and lower productivity. It has therefore been a goal to establish a technique for further suppressing anomalous discharge.

For thin-film solar cells, the most important issue is to achieve high photoelectric conversion efficiency and high heat-proof humidity resistance. Consequently, the transparent electrodes used therein must also contribute to increased photoelectric conversion efficiency and heat-proof humidity resistance of solar cells.

As existing transparent electrodes for thin-film solar cells there are used oxide transparent conductive films such as fluorine-added tin oxide films, tin- or zinc-added indium oxide films and aluminum-, gallium- and/or boron-added zinc oxide films. Tin-added indium oxide films, in particular, have low resistance and excellent durability as disclosed in PTL 3 and PTL 4. They have therefore been suitably used as transparent electrodes in thin-film solar cells.

However, tin-added indium oxide films have high carrier-caused reflection in the near-infrared region, and hence low transmittance. For this reason, they cannot efficiently utilize sunlight across a wide wavelength range, and their low photoelectric conversion efficiency has been a problem. Films that can increase photoelectric conversion efficiency have therefore been desired.

CITATION LIST

Patent Literature

[PTL 1] Japanese Unexamined Patent Application Publication No. 2003-105532
[PTL 2] WO2009/044888
[PTL 3] Japanese Unexamined Patent Application Publication HEI No. 9-78236
[PTL 4] Japanese Unexamined Patent Application Publication HEI No. 9-219530

SUMMARY OF INVENTION

Technical Problem

The present invention has been accomplished with the aim of solving the problems described above, and according to one aspect thereof, its object is to provide a sputtering target that is suitable for formation of oxide transparent conductive films for solar cells which require excellent optical transparency, and that can adequately reduce anomalous discharge during sputtering. Another object thereof is to provide an oxide sintered compact that can be suitably used as such a sputtering target.

According to another aspect, the object of the invention is to provide an oxide transparent conductive film with excellent durability, that can form a solar cell with high photoelectric conversion efficiency, and that has low resistance and high transmittance in a wide wavelength range from the visible light region to the infrared region.

According to yet another aspect, it is an object of the invention to provide a solar cell with high photoelectric conversion efficiency.

Solution to Problem

The present inventors have conducted much diligent research in light of the circumstances described above. As a result, focus was placed on sputtering methods using sputtering targets as film-forming methods for oxide transparent conductive films, because they allow formation of films with uniform film thicknesses over large areas. The use of oxide sintered compacts with specific compositions and structures as sputtering targets was also investigated. As a result, there were discovered an oxide sintered compact and sputtering target, that limit generation of anomalous discharge during film formation by sputtering, and suppress the particle-induced reduction in yield, and that have high light transmittance not only in the visible light region but also in the infrared region, and that can yield highly reliable oxide transparent conductive films.

The sputtering target was also used to obtain an oxide transparent conductive film having high light transmittance in a wide wavelength range and exhibiting excellent reliability, and the invention has been completed upon this discovery.

In addition, it was found that the photoelectric conversion efficiency can be increased in a solar cell having at least an oxide transparent conductive film and a photoelectric conversion layer layered on a substrate, if the oxide transparent conductive film is composed mainly of indium, tin, strontium and oxygen, being composed essentially of a crystalline bixbite-type indium oxide phase, with a specific compositional range, and the invention was further completed upon this finding.

Specifically, according to one aspect, the invention provides an oxide sintered compact composed of a bixbite-type oxide phase and a perovskite-type oxide phase, or a bixbite-type oxide crystal phase, the crystal phase having indium, tin, strontium and oxygen as the constituent elements, and the indium, tin and strontium contents satisfying the following formulas (1) and (2) in terms of atomic ratio.

$$Sn/(In+Sn+Sr)=0.01\text{-}0.11 \quad (1)$$

$$Sr/(In+Sn+Sr)=0.0005\text{-}0.004 \quad (2)$$

[In formulas (1) and (2), In, Sn and Sr represent the indium, tin and strontium contents (atomic percent), respectively.]

The oxide sintered compact of the invention is composed of a bixbite-type oxide phase and a perovskite-type oxide phase as crystal phases, and the bixbite-type oxide phase and perovskite-type oxide phase preferably each contain indium, tin, strontium and oxygen as constituent elements. The oxide sintered compact of the invention also preferably contains no tin oxide phase or strontium oxide phase as crystal phases. The oxide sintered compact of the invention preferably has strontium present only in the perovskite-type oxide phase.

The mean particle size of the perovskite-type oxide phase in the oxide sintered compact of the invention is preferably no greater than 5 μm.

According to another aspect, the invention provides a method for manufacturing the oxide sintered compact described above. The manufacturing method has a step of pre-mixing a strontium-containing powder and a tin-containing powder to prepare a first mixed powder in which strontium and tin satisfy the following formula (3) in terms of atomic ratio, a step of calcining the mixed powder at 800° C. to 1200° C. to adjust the mean particle size to no greater than 0.5 μm, to obtain calcined powder, a step of mixing the calcined powder with indium oxide powder and tin oxide powder to prepare a second mixed powder in which indium, tin and strontium satisfy the following formulas (1) and (2) in terms of atomic ratio, and a step of molding and firing the second mixed powder to obtain the oxide sintered compact.

$$Sn/(In+Sn+Sr)=0.01\text{-}0.11 \quad (1)$$

$$Sr/(In+Sn+Sr)=0.0005\text{-}0.004 \quad (2)$$

$$Sn/(Sn+Sr)=0.4\text{-}0.6 \quad (3)$$

[In formulas (1), (2) and (3), In, Sn and Sr represent the indium, tin and strontium contents (atomic percent), respectively.]

According to yet another aspect, the invention provides a sputtering target comprising the aforementioned oxide sintered compact.

According to yet another aspect, the invention provides a method for manufacturing an oxide transparent conductive film that includes a step of using the aforementioned sputtering target for sputtering.

According to still yet another aspect, the invention provides an oxide transparent conductive film composed of a crystalline bixbite-type indium oxide phase, the bixbite-type indium oxide phase containing indium, tin, strontium and oxygen as constituent elements, and the indium, tin and strontium contents satisfying formulas (1) and (2) above in terms of atomic ratio. Such an oxide transparent conductive film may be one obtained by the manufacturing method described above.

According to still yet another aspect, the invention provides a solar cell in which a substrate, a photoelectric conversion layer and an oxide transparent conductive film are layered. The oxide transparent conductive film in this solar cell is composed of a bixbite-type indium oxide phase, the bixbite-type indium oxide phase containing indium, tin, strontium and oxygen as constituent elements, and indium, tin and strontium contents satisfying formulas (1) and (2) above in terms of atomic ratio.

The indium, tin and strontium contents in the oxide transparent conductive film of the solar cell of the invention preferably satisfy the following formulas (4) and (5) and more preferably satisfy the following formulas (4) and (6), in terms of atomic ratio.

$$Sn/(In+Sn+Sr)=0.03\text{-}0.08 \quad (4)$$

$$Sr/(In+Sn+Sr)=0.0005\text{-}0.004 \quad (5)$$

$$Sr/(In+Sn+Sr)=0.0008\text{-}0.004 \quad (6)$$

[In formulas (4), (5) and (6), In, Sn and Sr represent indium, tin and strontium contents (atomic percent), respectively.]

The photoelectric conversion layer in the solar cell of the invention is preferably a silicon-based semiconductor or compound semiconductor. The compound semiconductor preferably has a p-type zinc blende-related structure, and more preferably it has a p-type chalcopyrite-type structure.

The solar cell of the invention preferably has an n-type buffer layer and an oxide transparent conductive film layered on the compound semiconductor, in that order from the compound semiconductor side. The n-type buffer layer is preferably an oxide transparent conductive film containing zinc oxide as the major component.

The oxide transparent conductive film in the solar cell of the invention is preferably one formed by sputtering.

According to still yet another aspect, the invention provides an oxide transparent conductive film for a solar cell, which is composed of a crystalline bixbite-type oxide phase, the bixbite-type oxide phase having indium, tin, strontium and oxygen as constituent elements, and indium, tin and strontium contents satisfying the following formulas (1) and (2) in terms of atomic ratio, $$Sn/(In+Sn+Sr)=0.01\text{-}0.11 \quad (1)$$

$$Sr/(In+Sn+Sr)=0.0005\text{-}0.004 \quad (2)$$

[In formulas (1) and (2), In, Sn and Sr represent the indium, tin and strontium contents (atomic percent), respectively.]

Advantageous Effects of Invention

The oxide sintered compact of the invention may be suitably used as a sputtering target. By using the sputtering target for sputtering, it is possible to produce an oxide transparent conductive film, while minimizing anomalous discharge during sputtering. The oxide transparent conductive film has excellent optical transparency in the visible light region and the infrared region, and excellent durability. Therefore, when it is used in a solar cell, for example, it can utilize sunlight energy in the infrared region in a highly efficient manner, which has not been possible in the prior art. It is thus possible to provide a solar cell with high photoelectric conversion efficiency.

The solar cell of the invention has high photoelectric conversion efficiency. The term "solar cell", as used herein, includes solar cells that employ oxide transparent conductive films, such as silicon-based solar cells employing single crystal silicon, polycrystalline silicon and amorphous silicon, compound-based solar cells such as $CuInSe_2$, $Cu(In, Ga)Se_2$, GaAs and CdTe, and dye-sensitized solar cells.

An oxide transparent conductive film to be used in a solar cell of the invention exhibits excellent optical transparency even when formed at low temperatures of up to 200° C. In addition, the oxide transparent conductive film has low thickness-dependence for its durability, and can be adjusted to any desired resistance, transmittance and durability. It is therefore possible to effectively direct sunlight to the photoelectric conversion layer of the solar cell. The oxide transparent conductive film also has a strong effect of preventing reduction in the fill factor of the solar cell, and the photoelectric conversion efficiency is therefore extremely high. It is thus possible to obtain a solar cell with high heat-proof humidity resistance.

DESCRIPTION OF EMBODIMENTS

Preferred embodiments of the invention will now be described in detail.

[Oxide Sintered Compact]

Figure 1:
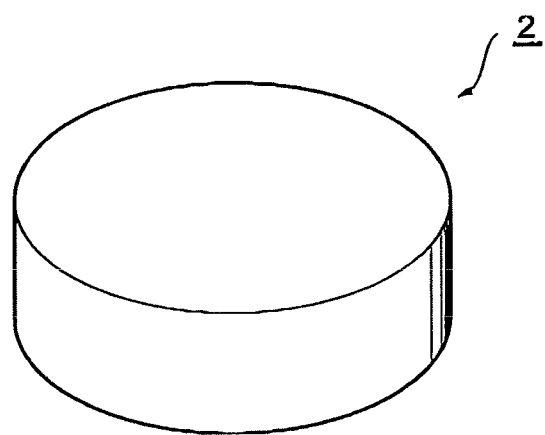
FIG. 1 is an oblique view showing an embodiment of an oxide sintered compact of the invention.

FIG. 1 is an oblique view showing the oxide sintered compact 2 of this embodiment. The oxide sintered compact 2 of this embodiment contains indium, tin, strontium and oxygen as the main elements. The oxide sintered compact 2 is composed of a crystal phase which is essentially a bixbite-type oxide phase and perovskite-type oxide phase, or a crystal phase consisting essentially of a bixbite-type oxide phase. The crystal phase has indium, tin, strontium and oxygen as constituent elements, and is composed mainly of these elements. The indium, tin and strontium contents of the oxide sintered compact 2 satisfy the following relational expressions, in terms of atomic ratio.

$$Sn/(In+Sn+Sr)=0.01-0.11 \quad (1)$$

$$Sr/(In+Sn+Sr)=0.0005-0.004 \quad (2)$$

In formulas (1) and (2), In, Sn and Sr represent the indium, tin and strontium contents (atomic percent), respectively.

The oxide sintered compact 2 having this composition and crystal phase can adequately reduce anomalous discharge during sputtering.

The oxide sintered compact 2 is composed of a crystal phase which is a bixbite-type oxide phase or perovskite-type oxide phase, or a bixbite-type oxide crystal phase. That is, the oxide sintered compact 2 contains essentially no crystal phase different from a bixbite-type oxide phase or perovskite-type oxide phase. This means that in the range of 2Θ=20-60° for an X-ray diffraction test using Cu as the line source, as demonstrated by the examples of the present specification, no diffraction peak is detected for any crystal phase other than a bixbite-type oxide phase and perovskite-type oxide phase.

Specifically, the following two embodiments are possible when the oxide sintered compact 2 is composed of a crystal phase that is a bixbite-type oxide phase and perovskite-type oxide phase. The first embodiment is one in which the oxide sintered compact 2 consists entirely of a bixbite-type oxide phase and a perovskite-type oxide phase as the crystal phases. The second embodiment is one in which, in addition to a bixbite-type oxide phase and a perovskite-type oxide phase, it contains a crystal phase other than a bixbite-type oxide phase and perovskite-type oxide phase, in an amount that is undetectable in the X-ray diffraction test conducted in the examples of the present specification.

Similarly, the following two embodiments are possible when the oxide sintered compact 2 is composed of a bixbite-type oxide crystal phase. The first possibility is that the oxide sintered compact 2 consists entirely of a bixbite-type oxide phase as the crystal phase. The second embodiment is that, in addition to a bixbite-type oxide phase, it contains a crystal phase other than a bixbite-type oxide phase, in an amount that is undetectable in the X-ray diffraction test conducted in the examples of the present specification.

Therefore, it may be restated that the oxide sintered compact 2 of this embodiment consists essentially of a crystal phase of a bixbite-type oxide phase and perovskite-type oxide phase, or a bixbite-type oxide crystal phase. The oxide sintered compact 2 of this embodiment may also include a trace amorphous structure.

A bixbite-type oxide phase in the oxide sintered compact 2 can be confirmed by an X-ray diffraction test using Cu as the line source. Specifically, if the diffraction peak detected within 2Θ=20-60° can be indexed to the peak pattern for indium oxide ($In_2O_3$) according to JCPDS (Joint Committee for Powder Diffraction Standards) 6-416, or a peak pattern (shifted peak pattern) which is similar to that, then the oxide sintered compact 2 contains a bixbite-type oxide phase.

A perovskite-type oxide phase in the oxide sintered compact 2 can also be confirmed by an X-ray diffraction test using Cu as the line source. Specifically, if the diffraction peak detected within 2Θ=20-60° can be indexed to the peak pattern for $SrSnO_3$ according to JCPDS (Joint Committee for Powder Diffraction Standards) 22-1442, or a peak pattern (shifted peak pattern) which is similar to that, then the oxide sintered compact 2 contains a perovskite-type oxide phase. A perovskite-type oxide phase generally exhibits a diffraction peak arising from the (422) plane, near 2Θ=55°. However, this diffraction peak is difficult to confirm because it overlaps with the bixbite-type oxide phase diffraction peak.

If the tin element content is within the range specified above, it will be possible to obtain an oxide transparent conductive film with low resistance and with excellent transparency in the visible light region and infrared region. Furthermore, if the strontium element content is within the range specified above, it will be possible to obtain a highly reliable oxide transparent conductive film. Therefore, if the tin element content and the strontium element content are both within the ranges specified above, it will be possible to obtain an oxide transparent conductive film with low resistance and with excellent transparency in the visible light region and infrared region, as well as high reliability.

The oxide sintered compact 2 is preferably composed mainly of indium, tin, strontium and oxygen. However, it may also contain unavoidable trace impurities, including elements other than those mentioned above.

The oxide sintered compact 2 of this embodiment has a relative density of more preferably 97% or greater and even more preferably 99% or greater. This sintered density range can further reduce anomalous discharge during sputtering.

The term "relative density" as used herein is calculated by the following procedure.

The weight ratios of In, Sn and Sr are determined as the oxides $In_2O_3$, $SnO_2$ and $SrO$, respectively. The determined weight ratios of $In_2O_3$, $SnO_2$ and $SrO$ are recorded as a (wt %), b (wt %) and c (wt %), respectively. Next, the respective true densities, $In_2O_3$: 7.18 g/cm$^3$, $SnO_2$: 6.95 g/cm$^3$ and $SrO$: 4.7 g/cm$^3$, are used to calculate the theoretical density A (g/cm$^3$).

$$A=(a+b+c)/((a/7.18)+(b/6.95)+(c/4.7))$$

The density B (g/cm$^3$) of the oxide sintered compact 2 is measured by Archimedes' method, based on JIS-R1634-1998.

The relative density (%) is calculated by the following formula, as the relative value of the density B (g/cm$^3$) of the sintered material with respect to the arithmetically calculated theoretical density A (g/cm$^3$).

$$\text{Relative density (\%)}=B/A\times100$$

The oxide sintered compact 2 of this embodiment preferably has tin and strontium present in the bixbite-type oxide phase and perovskite-type oxide phase. Also, the oxide sintered compact 2 of this embodiment preferably includes no tin oxide phase or strontium oxide phase. A tin oxide phase and strontium oxide phase are crystals with high resistance, or insulating crystals. When these are present in the oxide sintered compact 2, therefore, they can cause anomalous discharge during sputtering. Consequently, tin and strontium preferably are not present as a tin oxide phase or strontium oxide phase in the oxide sintered compact 2, but are present as a bixbite-type oxide phase and perovskite-type oxide phase.

For this embodiment, preferably all of the strontium in the oxide sintered compact 2 is present in the perovskite-type oxide phase. This results in even more satisfactory conductivity and can still further reduce anomalous discharge during sputtering.

The mean particle size of the particles in the perovskite-type oxide phase of the oxide sintered compact 2 of this embodiment is preferably no greater than 5 μm. This can still further reduce anomalous discharge during sputtering.

Throughout the present specification, the mean particle size of particles in the oxide sintered compact 2 is the value measured by the following procedure. First, the oxide sintered compact 2 is cut to an appropriate size. Then after polishing the observation surface, chemical etching is performed with a dilute hydrochloric acid solution to clarify the grain boundaries. The sample is photographed using EPMA, SEM/EDS, XRD or the like to obtain an observation photograph of the polished surface of the sintered material, and the composition of each of the particles is confirmed. For determination of the mean particle size of particles having the $SrSnO_3$-like structure of perovskite-type oxide, the composition is confirmed, and then the long diameters of at least 500 of the particles in the observation photograph are determined and the arithmetic mean value is calculated. The value determined in this manner is recorded as the mean particle size.

The oxide sintered compact 2 of this embodiment can adequately inhibit anomalous discharge during film formation, and therefore allows continuous prolonged film formation. The oxide sintered compact 2 of this embodiment is an oxide sintered compact 2 composed of indium, tin, strontium and oxygen as the major elements, and preferably it is composed essentially of a crystal phase which is a bixbite-type oxide phase and perovskite-type oxide phase, or it is composed essentially of a bixbite-type oxide crystal phase alone. The tin and strontium contents in the oxide sintered compact 2 satisfy formulas (1) and (2) above, in terms of atomic ratio.

[Method for Manufacturing Oxide Sintered Compact]

In the manufacturing method of this embodiment, first the total amount of the powder that is to serve as the strontium source and the powder that is to serve as the tin source are pre-mixed so that the content of each element as atomic percent satisfies the following formula (3), in terms of atomic ratio. The starting powders in this case are not particularly restricted, and may be oxides such as tin oxide, strontium oxide or compounds thereof. There may also be used nitrates, chlorides, carbonates or alkoxides of tin or strontium, that are converted to tin oxide and strontium oxide by firing. From the viewpoint of handleability, the tin source is preferably an oxide powder, and the strontium source is preferably a carbonate or oxide.

$$Sn/(Sn+Sr)=0.4-0.6 \tag{3}$$

In formula (3), In, Sn and Sr represent the indium, tin and strontium contents (atomic percent), respectively.

The mean particle sizes of the powders are preferably no greater than 1.5 μm and more preferably 0.1 to 1.5 μm, from the viewpoint of handleability. Using such a powder can also increase the sintered material density.

There are no particular restrictions on the method of pre-mixing. Examples of methods of pre-mixing include dry or wet media agitation mill mixing using balls or beads of zirconia, alumina, nylon resin or the like, or medialess rotating vessel mixing and mechanical agitation mixing. Specifically, there may be used a ball mill, bead mill, attritor, vibrating mill, planetary mill, jet mill, V-shaped mixer, paddle mixer, biaxial planetary stirring mixer, or the like. When a wet ball mill or bead mill, attritor, vibrating mill, planetary mill, jet mill or the like is used, the crushed slurry must be dried. The drying method is not particularly restricted, and examples include filtration drying, fluidized bed drying and spray-drying. When a metal salt solution or alkoxide solution is to be used as the starting material, the precipitate deposited from the solution is preferably dried.

The obtained pre-mixed powder (first mixed powder) is calcined at 800° C. to 1200° C. The calcination temperature is preferably 800° C. to 1000° C., and the calcination time is preferably 1 to 3 hours. The obtained calcined product is subjected to shredding treatment to a mean particle size of no greater than 0.5 μm, to obtain a calcined powder. There are no particular restrictions on the treatment methods for shredding, for example. Examples of treatment methods include those employing a dry or wet media agitation mill using balls or beads of zirconia, alumina, nylon resin or the like. More specifically, there may be used a ball mill, bead mill, attritor, vibrating mill, planetary mill, jet mill or the like. When a wet ball mill or bead mill, attritor, vibrating mill, planetary mill, jet mill or the like is to be used, the crushed slurry must be dried. The drying method is not particularly restricted, and examples include filtration drying, fluidized bed drying and spray-drying.

Next, indium oxide powder and tin oxide powder are added to and mixed with the calcined powder, to obtain a mixed powder for molding (second mixed powder) satisfying formulas (1) and (2) above. By using indium oxide powder and tin oxide powder it is possible to minimize complexity of the procedure and reduce auxiliary operations such as powder processing. When the indium source or tin source is not an oxide but a nitrate, chloride or carbonate, for example, it may be used after calcination to an oxide. The mean particle sizes of the powders are preferably no greater than 1.5 μm and more preferably 0.1 to 1.5 μm, from the viewpoint of handleability. Using such powders can further increase the sintered material density.

The mixing method for preparation of the second mixed powder is not particularly restricted, and examples include mixing methods such as dry or wet media stirrer mill mixing using balls or beads of zirconia, alumina, nylon resin; media-less rotating vessel mixing; mechanical agitation mixing; or the like. More specifically, there may be used a ball mill, bead mill, attritor, vibrating mill, planetary mill, jet mill, V-shaped mixer, paddle mixer, biaxial planetary stirring mixer, or the like. When a wet ball mill or bead mill, attritor, vibrating mill, planetary mill, jet mill or the like is used, the crushed slurry must be dried. The drying method is not particularly restricted, and examples include filtration drying, fluidized bed drying and spray-drying.

The second mixed powder may be subjected to granulation treatment or the like for improved manageability in the molding step. Such procedures can also improve the moldability and sinterability.

For this embodiment, the powder as the indium source, the powder as the tin source and the powder as the strontium source are combined in a proportion such that the contents of each of the metal elements in the oxide sintered compact 2 satisfy formulas (1) and (2) above, in terms of atomic ratio.

If the tin element content is within the range of formula (1) above, it will be possible to obtain an oxide transparent conductive film with low resistance and with excellent transparency not only in the visible light region but also in the infrared region. Furthermore, if the strontium element content is in. the range of formula (2) above, it will be possible to obtain a highly reliable oxide transparent conductive film. Therefore, if the tin element and the strontium element contents are both within the ranges of formulas (1) and (2) above, it will be possible to obtain an oxide transparent conductive film with low resistance and with excellent transparency not only in the visible light region but also in the infrared region, as well as high reliability.

The obtained second mixed powder (molding powder) is then molded. The molding method is not particularly restricted, but preferably the molding method is appropriately selected to allow molding to the desired shape. Examples of molding methods include press molding and cast molding. The molding pressure is not particularly restricted so long as it allows a manageable compact to be obtained without generating cracks. The molding density is preferably as high as possible. A method such as cold isostatic pressure (CIP) molding may be employed for this purpose. If necessary, an organic additive may be used to improve the moldability.

When an additive is used during molding, it is preferred to carry out heat treatment by heating a compact to 80° C. to 500° C. to remove the moisture and organic additive remaining in the compact. The temperature for heat treatment may be appropriately selected according to the amount and type of residual moisture and additive.

The obtained compact is then fired. There are no particular restrictions on the temperature-elevating rate. The temperature-elevating rate is preferably 10° C. to 400° C./hr, for example, from the viewpoint of shortening the firing time and preventing cracking. The firing temperature is preferably 1350° C. or higher and below 1650° C., and more preferably it is 1400° C. to 1625° C. This will promote solid solution of tin oxide into the indium oxide lattice at low temperature, exceeding the solubility limit. It will also be easier to form a crystal phase of the oxide sintered compact 2 that is essentially a bixbite-type oxide phase and perovskite-type oxide phase, or essentially a bixbite-type oxide phase. The time for holding at the firing temperature is preferably 1 hour or longer, and more preferably 3 to 10 hours. This will allow a high-density oxide sintered compact to be obtained. The temperature-lowering rate is not particularly restricted so long as it is set within the usual range, and it is preferably 10° C. to 500° C./hr from the viewpoint of shortening the firing time and preventing cracking.

The firing is preferably carried out in an oxygen-containing atmosphere, and more preferably in an oxygen stream. The firing is more preferably carried out in an oxygen stream with a ratio between the flow rate of oxygen introduced into the furnace (L/min) and the weight of the compact (kg) (compact weight/oxygen flow rate) of no greater than 1.0. This will allow a high-density oxide sintered compact to be obtained.

[Sputtering Target]

The sputtering target of this embodiment comprises the oxide sintered compact 2 described above. An oxide transparent conductive film formed by sputtering using such a sputtering target has low resistivity, excellent optical transparency not only in the visible light region but also the infrared region, and also excellent reliability. Such a sputtering target also has excellent discharge characteristics during film formation. It therefore inhibits anomalous discharge during sputtering, and allows stable film formation.

The sputtering target of this embodiment may be the aforementioned oxide sintered compact 2 used directly, or it may be the oxide sintered compact 2 worked into a prescribed shape.

The surface roughness of the sputtering surface of the sputtering target of this embodiment is preferably no greater than 3 μm and more preferably no greater than 2 as the center line average roughness (Ra). This can further inhibit the number of anomalous discharges during film formation, to allow stable film formation. The center line average roughness (Ra) can be adjusted by a method of machining the sputtering surface of the oxide sintered compact 2 using different number grinding stones, or a method of vapor blasting, such as sand blasting. Alternatively, the center line average roughness (Ra) can be determined by evaluating the sputtering surface with a surface texture meter.

A sputtering method using the oxide sintered compact 2 described above as a sputtering target will now be described. The sputtering method may be appropriately selected from among DC sputtering, RF sputtering, AC sputtering, DC magnetron sputtering, RF magnetron sputtering and ion beam sputtering. Of these, DC magnetron sputtering and RF magnetron sputtering are preferred to allow film formation uniformly and at high speed over large areas.

There are no particular restrictions on the temperature of the substrate to be used for sputtering. Therefore, the temperature of the substrate may be appropriately adjusted according to the heat resistance of the substrate. For example, when non-alkaline glass is used as the substrate, the temperature of the substrate is preferably no higher than 250° C., and when a resin film is used as the substrate, it is preferably no higher than 150° C. Film formation may also be at this temperature when the substrate to be used is one with excellent heat resistance, such as quartz, ceramic, metal or the like.

The atmosphere gas for sputtering will usually be an inert gas such as argon gas, for example. If necessary, oxygen gas, nitrogen gas or hydrogen gas may be used,

[Solar Cell and Oxide Transparent Conductive Film]

Preferred embodiments of the solar cell of the invention will now be explained. In a solar cell according to this embodiment, the oxide transparent conductive film and photoelectric conversion layer may be layered in direct contact, or they may be layered with another layer between them. The photoelectric conversion layer, which converts sunlight to electricity, comprises at least an n-type semiconductor and a p-type semiconductor. Specifically, this configuration includes pn-types comprising a layered n-type semiconductor and p-type semiconductor, pin-types having an insulating layer (i layer) lying between an n-type semiconductor and a p-type semiconductor, and structures in which several different types of these junctions are layered.

These photoelectric conversion layers have electrodes formed on both sides, either directly or via other layers, and at least one side thereof is an oxide transparent conductive film composed mainly of indium, tin, strontium and oxygen, and consisting essentially of a crystalline bixbite-type indium oxide phase, the tin and strontium contents satisfying the following formulas (1) and (2) in terms of atomic ratio.

$$Sn/(In+Sn+Sr)=0.01-0.11 \quad (1)$$

$$Sr/(In+Sn+Sr)=0.0005-0.004 \quad (2)$$

In formulas (1) and (2), In, Sn and Sr represent the indium, tin and strontium contents (atomic percent), respectively.

The oxide transparent conductive film is composed of a crystalline bixbite-type indium oxide phase. This means that in the range of 2Θ=20-60° for an X-ray diffraction test using Cu as the line source, as demonstrated by the examples of the present specification, no diffraction peak is detected for any crystal phase other than a bixbite-type indium oxide phase. In other words, the oxide transparent conductive film contains essentially no crystal phase different from a bixbite-type indium oxide phase.

The following two embodiments are possible for the oxide transparent conductive film of this embodiment. For the first embodiment, the oxide transparent conductive film contains only a bixbite-type indium oxide phase as the crystal phase. For the second embodiment, in addition to a bixbite-type indium oxide phase, it contains a crystal phase different from a bixbite-type indium oxide phase, in an amount that is undetectable in the X-ray diffraction test conducted in the examples of the present specification.

Therefore, it may be restated that the oxide transparent conductive film of this embodiment consists essentially of a crystalline bixbite indium phase. The oxide transparent conductive film of this embodiment may also include a trace amorphous structure.

If the tin content is within a range satisfying formula (1) above, it will be possible to obtain an oxide transparent conductive film with low resistance and with excellent transparency not only in the visible light region but also in the infrared region. Also, if the strontium content is within a range satisfying formula (2) above, it will be possible to obtain an oxide transparent conductive film having excellent transparency not only in the visible light region but also in the infrared region, as well as high reliability, and also both high heat resistance and humidity resistance. Therefore, if both the tin and strontium contents are within the ranges specified above, it is possible to obtain an oxide transparent conductive film with low resistance, having even more excellent transparency not only in the visible light region but also in the infrared region, and also having both high heat resistance and humidity resistance.

A solar cell comprises an oxide transparent conductive film with such excellent properties as a transparent electrode. It therefore exhibits high conversion efficiency, and both high heat resistance and humidity resistance.

The tin and strontium contents of the oxide transparent conductive film (atomic percent) preferably satisfy the following formulas (4) and (5). This can still further increase the conversion efficiency.

$$Sn/(In+Sn+Sr)=0.03-0.08 \quad (4)$$

$$Sr/(In+Sn+Sr)=0.0005-0.004 \quad (5)$$

In formulas (4) and (5), In, Sn and Sr represent the indium, tin and strontium contents (atomic percent), respectively.

The tin and strontium contents of the oxide transparent conductive film even more preferably satisfy the following formulas (4) and (6), in terms of atomic ratio. This can still further increase the conversion efficiency.

$$Sn/(In+Sn+Sr)=0.03-0.08 \quad (4)$$

$$Sr/(In+Sn+Sr)=0.0008-0.004 \quad (6)$$

In formulas (4) and (6), In, Sn and Sr represent the indium, tin and strontium contents (atomic percent), respectively.

The oxide transparent electrode is composed mainly of indium, tin, strontium and oxygen, but it may also include unavoidable trace impurities.

The solar cell of this embodiment is preferably the aforementioned solar cell wherein the photoelectric conversion layer is a silicon-based semiconductor. It is most preferably a thin-film type silicon-based semiconductor. Since a thin-film type solar cell has a thin photoelectric conversion layer, sunlight must be taken in effectively across a wide wavelength range if the photoelectric conversion efficiency is to be further increased. The solar cell of this embodiment can exhibit very high photoelectric conversion efficiency when a silicon-based semiconductor is used in the photoelectric conversion layer.

The solar cell of this embodiment is preferably the aforementioned solar cell wherein the photoelectric conversion layer is a compound semiconductor. Most preferably, it is a thin-film type compound semiconductor. Since a thin-film type solar cell has a thin photoelectric conversion layer, sunlight must be taken in effectively across a wide wavelength range if the photoelectric conversion efficiency is to be further increased. The solar cell of this embodiment can exhibit very high photoelectric conversion efficiency when a compound semiconductor is used in the photoelectric conversion layer. The effect is particularly high when the compound semiconductor is a compound semiconductor having a p-type zinc blende-related structure.

Preferably in the solar cell of this embodiment, the compound semiconductor with a p-type zinc blende-related structure is a compound semiconductor with a p-type chalcopyrite-type structure, an n-type buffer layer is layered on the compound semiconductor, and the oxide transparent conductive film is layered on the n-type buffer layer. Here, the compound semiconductor with a p-type chalcopyrite-type structure, the n-type buffer layer and the oxide transparent conductive film may each be layered in direct contact, or they may be layered via another layer situated between them. Such a structure can further increase the photoelectric conversion efficiency. The effect is particularly high when the n-type buffer layer is an oxide transparent film composed mainly of zinc oxide.

Figure 2:
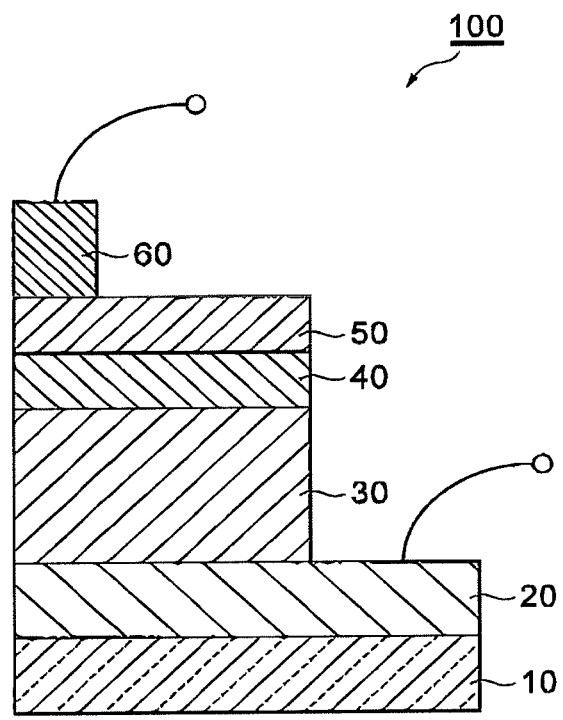
FIG. 2 is a cross-sectional view schematically showing the cross-sectional structure of a solar cell according to the invention.

A preferred embodiment of the solar cell and oxide transparent conductive film of the invention will now be described in detail. FIG. 2 schematically shows the cross-sectional structure of a chalcopyrite-type thin-film solar cell according to this embodiment. The solar cell 100 has a layered structure with a substrate 10, a back side metal electrode 20, a photo-electric conversion layer 30, a buffer layer 40, a transparent electrode 50 and a front side metal electrode 60, layered in that order.

The substrate 10 used may be a substrate commonly used in solar cells. For example, it may be a glass substrate, a metal substrate, a plastic substrate or a ceramic substrate. A metal substrate may be a thick substrate with a thickness of a few mm, or a film-like thin substrate.

When a compound semiconductor with a p-type chalcopyrite-type structure is used as the photoelectric conversion layer 30, it is preferred to use a glass substrate which has high corrosion resistance for metal elements such as S, Se and Te, a silica-coated or NiP-plated metal substrate for improved corrosion resistance, or a plastic substrate. It is more preferred to use soda lime glass as the substrate because it is inexpensive.

A common electrode may be used as the back side metal electrode 20 layered on the substrate 10. For example, Mo, Cr, V, W, Ta, Nb or Mo alloy, Cr alloy, V alloy, W alloy, Ta alloy, Nb alloy or the like may be used.

The thickness of the back side metal electrode 20 is preferably 1 nm to 10 µm. If the thickness is less than 1 nm it will be too thin, and when a compound semiconductor layer with a p-type chalcopyrite-type structure is used as the photoelectric conversion layer 30, the crystal orientation will be insufficient, potentially resulting in reduced photoelectric conversion efficiency. There is no particular upper limit on the film thickness of the back side metal electrode 20, but it is preferably no greater than 10 µm from the viewpoint of productivity.

The film formation of the back side metal electrode 20 can be carried out by a known technique. It is preferred to employ a conventionally known vacuum apparatus for sputtering, vapor deposition or CVD, with sputtering being more preferred. Sputtering allows formation of a denser film with excellent crystal orientation. It will thus be possible to form a film uniformly across a large area. The substrate 10 is preferably heated to between 100° C. and 500° C.

A compound semiconductor having a p-type chalcopyrite-type structure is preferably a Group I, III or VI compound. There are preferably used at least one element selected from among Cu and Ag as the Group I element, at least one element selected from among Ga, In and Al as the Group III element, and at least one element selected from among S, Se and Te as the Group VI element. There are more preferably used Cu as the Group I element, at least one element selected from among In and Ga as the Group III element, and at least one element selected from among S and Se as the Group VI element. This can still further increase the photoelectric conversion efficiency.

Since In is a rare metal, Fe may be used in place of In, and therefore at least one element selected from among Fe and Ga may be used as the Group III element. However, the excellent photoelectric conversion efficiency will tend to be impaired, compared to using In.

The film-forming method used for the p-type chalcopyrite compound semiconductor may be a known method. In the case of Cu(In, Ga)(S, Se)$_2$, for example, first a Cu—Ga—In compound film is fabricated by sputtering using a Cu—Ga target or an In target. The fabricated film is then converted to selenide/sulfide at high temperature (400° C. to 800° C.) using hydrogen sulfide and hydrogen selenide. Instead of selenide/sulfide conversion at high temperature using hydrogen sulfide and hydrogen selenide, the fabrication may be by vapor deposition of S and Se, followed by annealing at high temperature (400° C. to 800° C.). A sputtering target containing a Group VI element may also be prepared, and the fabrication accomplished by film formation.

A Cu(In, Ga)(S, Se)$_2$ powder may also be prepared without using vacuum film formation, by coating and firing at high temperature (400° C. to 800° C.).

The film thickness of the compound semiconductor layer with a p-type chalcopyrite-type structure is preferably 0.1 µm to 10 µm. At less than 0.1 µm, it will be too thin and will tend to make it difficult to obtain sufficiently high photoabsorption. The upper limit of the film thickness is not particularly restricted, but it is preferably no greater than 10 µm from the viewpoint of productivity.

The front side metal electrode 60 may be formed in the same manner as the back side metal electrode 20, covering a portion of the transparent electrode 50 on the transparent electrode 50.

There are no particular restrictions on the film-forming method for the oxide transparent conductive film which is to compose the transparent electrode 50, and examples include PVD methods such as sputtering, ion plating or PLD, CVD methods such as thermal CVD or MOCVD, spray pyrolysis methods and coating methods such as spin coating. Of these, sputtering methods allow film formation uniformly over a large area and can increase stability of the in-plane characteristics. The sputtering method may be appropriately selected from among DC sputtering, RF sputtering, AC sputtering, DC magnetron sputtering, RF magnetron sputtering and ion beam sputtering. From the viewpoint of allowing film formation uniformly across a large area and a high speed, DC magnetron sputtering and RF magnetron sputtering are preferred.

The composition of the film obtained by sputtering reflects the composition of the oxide sintered compact 2 composing the target. Thus, by using an oxide sintered compact 2 having a composition satisfying formulas (1) and (2) as the target, it is possible to form an oxide transparent conductive film with low resistance and with even more excellent transparency not only in the visible light region but also in the infrared region, and exhibiting both high heat resistance and humidity resistance. The oxide transparent conductive film formed in this manner is composed essentially of a crystalline bixbite-type indium oxide phase, and contains essentially no crystal phase different from the bixbite-type indium oxide phase.

The temperature for film formation by sputtering is not particularly restricted, and it may be appropriately determined based on the heat resistance of the substrate and other film materials used. For example, when non-alkaline glass is used as the substrate, it is preferably no higher than 250° C., and when a resin film is used as the substrate, it is preferably no higher than 150° C. Consideration is also preferably given to the effects of deterioration of properties of the other layered film materials, and mutual diffusion at the layering interfaces. Film formation may be at a higher temperature when the substrate to be used is quartz, ceramic, metal or the like, which have excellent heat resistance.

When producing the solar cell 100 of this embodiment, a film with low resistance and excellent optical transparency can be obtained even if the oxide transparent conductive film which is to compose the surface electrode layer is formed at a low temperature of below 200° C. It is therefore possible to significantly improve the photoelectric conversion efficiency. This reduces restrictions on the material composing the sputtering apparatus, can reduce heat deformation of the structural material, and allows apparatus design using inexpensive materials. In other words, it is highly advantageous for the process. The lower limit of the substrate temperature during sputtering is not particularly restricted but is preferably 100° C. or higher.

The atmosphere gas for sputtering will usually be an inert gas such as argon gas. If necessary, oxygen gas, nitrogen gas or hydrogen gas may be used.

When film formation is carried out with a substrate temperature below 100° C. during sputtering, heat treatment is preferably carried out, in which the formed oxide transparent conductive film is heated at 100° C. or higher. The atmosphere for heat treatment is not particularly restricted, and an atmosphere of air, nitrogen or inert gas may be appropriately selected.

The oxide transparent conductive film obtained in this manner is suitable for use as a solar cell. Thus, the oxide transparent conductive film of this embodiment may be an oxide transparent conductive film for a solar cell which is composed of indium, tin, strontium and oxygen as the main element, and essentially composed of a crystalline bixbite-type indium oxide phase, the tin and strontium contents satisfying formulas (1) and (2) in terms of atomic ratio.

The sputtering target used for sputtering is preferably the oxide sintered compact 2 described above, for example. Alternatively, a sintered complex oxide may be produced in the following manner and used. Specifically, the manufacturing method comprises (1) a step of pre-mixing an indium compound powder and a powder of a different compound to prepare a molding powder in which the contents of each of the elements are within the prescribed ranges, (2) a step of molding the molding powder to form a compact, and (3) a step of firing the compact to produce a sintered material. Each step will now be explained in detail, (1) Powder Preparation Step The starting powders containing each element are not particularly restricted, and for example, there may be used metal oxide powders, metal hydroxide powders, metal salt powders such as chlorides, nitrates or carbonates, and metal alkoxides. Metal oxide powders are preferred among these from the viewpoint of handleability. When a non-metal oxide powder is to be used, the powder is first subjected to heat treatment in an oxidizing atmosphere such as air for use as a metal oxide powder.

The following explanation assumes the use of a metal oxide powder as the starting powder. The particle size of the metal oxide powder in the starting powder is preferably fine, from the viewpoint of homogeneity of the mixed state and increased sinterability. Thus, the primary particle size is preferably no greater than 10 μm and more preferably no greater than 1 μm. The metal oxide powder of an element other than indium is preferably an oxide powder having a smaller primary particle size than the primary particle size of the indium oxide powder. If the primary particle size of the indium oxide powder is smaller than or equal to that of the metal oxide powder of the element other than indium, the homogeneity of the mixed state will tend to be inferior.

Preferably, the mean particle size of the indium oxide powder is larger than the mean particle sizes of metal oxide powders of elements other than indium. This will allow even more uniform mixing of the starting powder. It will thus be possible to obtain a sintered complex oxide composed of particles with a fine mean particle size.

The BET specific surface area of the indium oxide powder and a metal oxide powder of an element other than indium is preferably 10 to 25 m$^2$/g, from the viewpoint of handleability. This will make it even easier to obtain the desired sintered complex oxide. For a metal oxide powder with a BET specific surface area of less than 10 m$^2$/g, preferably prior grinding treatment is carried out to adjust the BET specific surface area to between 10 and 25 m$^2$/g. A powder with a BET specific surface area of greater than 25 m$^2$/g may also be used. Because of increased powder bulk, however, preferably the powder is subjected to consolidation treatment beforehand to improve the manageability.

There are no particular restrictions on the method of mixing the powders, and examples include mixing methods such as dry or wet media stirrer mill mixing using balls or beads of zirconia, alumina, nylon resin or the like, medialess rotating vessel mixing and mechanical agitation mixing. More specifically, there may be used a ball mill, bead mill, attritor, vibrating mill, planetary mill, jet mill, V-shaped mixer, paddle mixer, biaxial planetary stirring mixer, or the like.

When the metal oxide powders containing each element are to be mixed, the powders are pulverized. The powder particle size after pulverizing is preferably as fine as possible. Mixing by a wet method is particularly preferred in terms of convenience and suitability for mixing homogeneity, high dispersion and micronization. When a wet method employing a ball mill or bead mill, attritor, vibrating mill, planetary mill, jet mill or the like has been used, the pulverized slurry must be dried. The drying method is not particularly restricted, and examples include filtration drying, fluidized bed drying and spray-drying.

When a powder other than an oxide is to be mixed, the mixing is preferably followed by calcination at 500° C. to 1200° C., and the obtained calcined powder is pulverized for use. The mean primary particle size after pulverizing is preferably no greater than 1 μm. This can further inhibit damage such as cracking and chipping during the molding and firing in the subsequent molding step.

The purity of each starting powder will usually be 99 mass % or greater, preferably 99.9 mass % or greater and more preferably 99.99 mass % or greater. If the purity of each starting powder is low, the impurities may adversely affect the properties of the transparent conductive film that is formed by a sputtering target using a sintered complex oxide.

The mixing ratio of the starting materials is reflected in the contents of the elements composing the sintered complex oxide that is obtained. The mixing ratio of each of the starting materials is adjusted so that the indium, tin and strontium contents in the sintered complex oxide satisfy the following formulas (1) and (2), preferably the following formulas (4) and (5) and more preferably the following formulas (4) and (6), in terms of atomic ratio.

$$Sn/(In+Sn+Sr)=0.01\text{-}0.11 \tag{1}$$

$$Sr/(In+Sn+Sr)=0.0005\text{-}0.004 \tag{2}$$

$$Sn/(In+Sn+Sr)=0.03\text{-}0.08 \tag{4}$$

$$Sr/(In+Sn+Sr)=0.0005\text{-}0.004 \tag{5}$$

$$Sr/(In+Sn+Sr)=0.0008\text{-}0.004 \tag{6}$$

In formulas (1), (2), (4), (5) and (6), In, Sn and Sr represent the indium, tin and strontium contents (atomic percent), respectively.

The mixed powder obtained in this manner (the calcined mixed powder, in the case of calcination) is preferably granulated before molding. This can increase the flow property during molding, and can improve productivity. The granulation method is not particularly restricted, and may be spray-drying granulation or tumbling granulation, for example. The granulated powder is preferably adjusted to a mean particle size of several μm to 1000 μm.

In the above explanation it is assumed that the starting powders are mixed simultaneously, but for example, the tin source and the strontium source may be mixed first, and then the indium source added to and mixed therewith. Alternatively, the indium source and the tin source may be mixed first, and then the strontium source added to and mixed therewith. Also instead, the indium source and the strontium source may be mixed first, and then the tin source added to and mixed therewith. Thus, there is no particular restriction on the order of mixing the starting powders.

(2) Molding Step

The molding method is not particularly restricted so long as it is a method that allows molding of the metal oxide mixed powder (the calcined mixed powder, in the case of calcination) or granulated powder into the desired shape. Examples include press molding, cast molding and injection molding. The molding pressure is not particularly restricted so long as it is in a range that allows a manageable compact to be obtained without generating cracks. In the case of press molding, for example, molding at between 500 kg/cm$^2$ (49.033 MPa) and 3.0 ton/cm$^2$ (294.2 MPa) will allow an oxide sintered compact with high density to be obtained. A method such as cold isostatic pressure (CTP) molding may be employed to increase the molding density. During the molding treatment, a molding aid such as polyvinyl alcohol, an acrylic polymer, methyl cellulose, a wax or oleic acid may also be used.

(3) Firing Step

The obtained compact is then fired. The temperature-elevating rate is not particularly restricted but is preferably 10° C. to 400° C./hr from the viewpoint of shortening the firing time and preventing cracking. The firing temperature is preferably 1350° C. to 1650° C., and more preferably 1400° C. or higher and no higher than 1625° C. The time for holding at this firing temperature is preferably 1 hour or longer, and more preferably 3 to 10 hours. This will allow a high-density sintered material to be obtained.

The temperature-lowering rate is not particularly restricted so long as it is set within the usual range, and it is preferably 10° C. to 500° C./hr from the viewpoint of shortening the firing step and preventing cracking.

The firing is preferably carried out in an oxygen-containing atmosphere, and more preferably in an oxygen stream. The firing is more preferably carried out in an oxygen stream with a ratio between the flow rate of oxygen introduced into the furnace (L/min) and the total weight of the compact charged into the furnace (kg) (compact total weight/oxygen flow rate) of no greater than 1.0. This will allow a high-density sintered material to be obtained.

The (2) molding step and (3) firing step may be carried out simultaneously. That is, production of the sintered material may be by hot pressing in which the powder prepared in the (1) powder preparation step is packed into a molding die and fired, or a method of melting and injection of the same powder at high temperature into the prescribed shape.

The obtained sintered material of the complex oxide may be suitably used as a sputtering target. The sintered complex oxide may be used directly as a sputtering target, or the sintered complex oxide may be worked into a prescribed shape to produce a sputtering target.

The surface roughness of the sputtering surface of the sputtering target is preferably no greater than 3 μm and more preferably no greater than 2 μm, as the center line average roughness (Ra). This can further inhibit the number of anomalous discharges during film formation, to allow stable film formation. The center line average roughness (Ra) can be adjusted by a method of machining the sputtering surface of the oxide sintered compact using different number grinding stones, or a method of vapor blasting, such as sand blasting. Alternatively, the center line average roughness (Ra) can be determined by evaluating the sputtering surface with a surface texture meter.

The transparent conductive film is obtained by a sputtering method employing such a sputtering target.

The solar cell 100 of this embodiment may be a chalcopyrite-type thin-film solar cell.

The buffer layer 40 preferably employs a structure comprising at least one compound selected from among CdS, InS, ZnS, ZnMgO, CdS/ZnO and CdS/ZnMgO.

The function of the buffer layer 40 is not completely understood, but one of its assumed roles is to cause diffusion of Cd, Zn and the like into the compound semiconductor layer with a p-type chalcopyrite-type structure, so that only the surface layer of the compound semiconductor layer with a p-type chalcopyrite-type structure is converted to n-type, thereby forming a pn homojunction structure. Among other conjectures it has been set forth that shunt paths are reduced because the buffer layer is a high resistance layer, but this role is not yet fully understood.

This type of chalcopyrite-type thin-film solar cell is characterized in that the oxide transparent conductive film described above is used as the transparent electrode 50.

Since the transparent electrode 50 must perform the function of taking in light across a very wide wavelength range, it must have high transmittance across a wide wavelength range. Furthermore, since solar cells are used in harsh environments, they must exhibit high performance stability. It is therefore desired to increase the durability of the members composing solar cells. The materials mentioned above are therefore suitable.

The solar cell 100 of this embodiment may be used as a stack type, in combination with another solar cell. In this case, the other solar cell is not limited to a compound semiconductor solar cell with a p-type chalcopyrite-type structure, and other types of solar cells may be used, such as silicon-based, organic thin-film or dye-sensitized types.

The solar cell of this embodiment may also be described in the following manner. That is, the solar cell of this embodiment has at least an oxide transparent conductive film and a photoelectric conversion layer layered on a substrate, the oxide transparent conductive film being composed of indium, tin, strontium and oxygen as the main elements, and consisting of essentially a crystalline bixbite-type indium oxide phase, the tin and strontium contents of the oxide transparent conductive film satisfying formulas (1) and (2) in terms of atomic ratio.

Preferred embodiments of the invention were described above, but the invention is in no way limited to these embodiments. For example, the solar cell 100 had a buffer layer 40 between the transparent electrode 50 and the photoelectric conversion layer 30, but the transparent electrode 50 may instead be formed in contact with the photoelectric conversion layer 30.

EXAMPLES

The invention will now be explained in greater detail by the following examples, with the understanding that the invention is not restricted by the examples.

<Evaluation of Oxide Sintered Compact>
(Composition)

This was quantified by ICP luminescence analysis.

(Sintered Density)

The sintered density of the oxide sintered compact was measured by Archimedes' method, according to JIS-R1634-1998.

(Mean Particle Size)

The mean particle size of particles with a perovskite structure in the oxide sintered compact was determined by the following procedure. A scanning electron microscope was used to record a polished surface photograph of the oxide sintered compact. After arbitrarily selecting 500 particles from the photograph, the long diameters of each of the particles were measured. The mean value was recorded as the mean particle size.

(X-Ray Diffraction Test)

The crystal phase of the oxide sintered compact was identified by an X-ray diffraction test. The measuring conditions were as follows.

X-ray source: CuKα
Power: 40 kV, 40 mA
Scanning rate: 1°/min

The obtained diffraction pattern was analyzed and classified as 1) bixbite-type oxide phase, 2) perovskite-type oxide phase or 3) crystal phase other than 1) or 2), such as tin oxide phase or strontium oxide phase. For each of the crystal phases 1), 2) and 3), "A" was assigned if a diffraction peak was detected, and "B" was assigned if it was not.

(Discharge Characteristic)

The oxide sintered compact was used for sputtering under the following sputtering conditions. The number of anomalous discharges produced per hour during sputtering was calculated.

Sputtering Conditions

Apparatus: DC magnetron sputtering apparatus (Ulvac, Inc.)
Magnetic field intensity: 1000 Gauss (directly above target, horizontal component)
Substrate temperature: Room temperature (approximately 25° C.)
Ultimate vacuum: $5 \times 10^{-5}$ Pa
Sputtering gas: argon+oxygen
[Oxygen ratio (by volume)=oxygen/(argon+oxygen)=0.005]
Sputtering gas pressure: 0.5 Pa
DC power: 200W
Sputtering time: 30 hours <Evaluation of Oxide Transparent Conductive Film>

(Transmittance)

The light transmittance of the integrated body of the substrate and oxide transparent conductive film was measured using a U-4100 spectrophotometer (trade name of Hitachi, Ltd.), at a wavelength in the range of 240 nm to 2600 nm. The transmittance of the oxide transparent conductive film was determined by the following formula.

[(Transmittance of integrated body of substrate and oxide transparent conductive film)/(transmittance of substrate alone)]×100(%)

(Resistivity)

The resistivity of the oxide transparent conductive film was measured using an HL5500 (trade name of Japan Bio-Rad Laboratories, Inc.).

(Reliability)

The oxide transparent conductive film was exposed to an environment at a temperature of 85° C. and a relative humidity of 85% for 1000 consecutive hours, and the change in resistivity was observed. Defining the resistivity before and after the test as A and B respectively, the value of (B−A)/A in % units was recorded as the reliability index. In most cases, this value tends to vary as the test time progresses. A value of near zero indicates stable properties and excellent reliability.

Example 1

(Fabrication of Oxide Sintered Compact)

The starting powders used were indium oxide powder with a purity of 99.99 mass % and a mean particle size of 0.5 μm, tin oxide powder with a purity of 99.99 mass % and a mean particle size of 0.5 μm, and strontium carbonate powder with a purity of 99.9 mass % and a mean particle size of 1 μm. The tin oxide powder and the strontium carbonate powder were mixed with a dry ball mill so that the tin, element and the strontium element mixing ratios (based on atomic percent) were the same [Sn/(Sn+Sr)=0.5], to prepare a mixed powder. The mixed powder was calcined in air at 1000° C. for 2 hours and then treated with a dry ball mill to obtain a calcined powder with a mean particle size of 0.2 μm.

The indium oxide powder and the tin oxide powder were combined with this calcined powder as listed in the "Final powder composition" column in Table 1 and mixed with a dry ball mill. The mean particle size of the mixed powder was 0.2 μm. The obtained powder was subjected to die molding using a die with a diameter of 150 mm at 0.3 ton/cm² (29.42 MPa), and then CIP molding at 3.0 ton/cm² (294.2 MPa), to obtain a compact. The compact was set in a sintering furnace with a pure oxygen atmosphere, and firing was carried out under the following conditions.

(Firing Conditions)

Temperature-elevating rate: 50° C./hr
Firing temperature: 1500° C.
Firing time: 5 hours
Firing atmosphere: Introduction of pure oxygen gas into the furnace from initial temperature elevation (room temperature) until completion of temperature reduction (100° C.).
Temperature-lowering rate: 100° C./hr The obtained oxide sintered compact was pulverized and the product phase was identified by an X-ray diffraction test. As a result, there was detected only a diffraction peak attributable to a bixbite-type oxide phase, while no diffraction peak was detected for other crystal phases. SEM and EPMA analyses were also conducted, and the presence of strontium in the bixbite-type oxide phase was confirmed. Evaluation of the oxide sintered compact was carried out by the method described above under "Evaluation of oxide sintered compact". The evaluation results are shown in Table 1.

(Fabrication of Oxide Transparent Conductive Film)

The obtained sintered material was worked to a size of 4-inchϕ (diameter: 102 mm), to fabricate a sputtering target. The sputtering surface of the sputtering target was polished using a surface grinding machine and a diamond grinding stone. The grinding stone number was changed to adjust the center line average roughness of the sputtering surface.

The obtained sputtering target was used for film formation by DC magnetron sputtering under the following conditions. After film formation, post-treatment was carried out to obtain an oxide transparent conductive film.

(Sputtering Film Formation Conditions)

Apparatus: DC magnetron sputtering apparatus
Magnetic field intensity: 1000 Gauss (directly above target, horizontal component)
Substrate temperature: Room temperature (approximately 25° C.)
Ultimate vacuum: $5 \times 10^{-5}$ Pa
Sputtering gas: argon+oxygen

[Oxygen ratio (by volume)=oxygen/(argon+oxygen)=0.005]

Sputtering gas pressure: 0.5 Pa
DC power: 200 W
Film thickness: 150 nm
Substrate used: Non-alkaline glass (#1737 Glass, trade name of Corning, Inc., thickness: 0.7 mm)

(Heat Treatment after Film Formation and Evaluation)

A sample comprising an oxide transparent conductive film formed on a substrate was heat treated under conditions of 200° C., 1 hour. Next, the generated phase of the oxide transparent conductive film was measured by the same method as the X-ray diffraction test for the oxide sintered compact. As a result, only a bixbite-type oxide phase was detected. That is, the oxide transparent conductive film was composed of a bixbite-type oxide phase. The oxide transparent conductive film was evaluated by the method described under "Evaluation of oxide transparent conductive film". The evaluation results are shown in Table 2.

Examples 2 to 13

Oxide sintered compacts and oxide transparent conductive films for Examples 2 to 13 were fabricated in the same manner as Example 1, except that the amounts of the indium oxide powder and the tin oxide powder added to the calcined powder obtained in the same manner as Example 1 were varied as shown in the "Final powder composition" column in Table 1.

The oxide sintered compacts of Examples 2 to 13 were pulverized, and the produced phases were identified in the same manner as Example 1 by an X-ray diffraction test. As a result, in Examples 2 to 4, 6, 7, 9, 10, 12 and 13, only diffraction peaks for a bixbite-type oxide phase and perovskite-type oxide phase were detected, while no diffraction peak for a tin oxide phase or strontium oxide phase was detected. On the other hand, in Examples 5, 8 and 11, only a diffraction peak for a bixbite-type oxide phase was detected, while no diffraction peak for a tin oxide phase or strontium oxide phase was detected.

Analysis was also conducted by SEM and EPMA. As a result, in Examples 2 to 4, 6, 7, 9, 10, 12 and 13, it was confirmed that strontium formed a compound with tin, and was present in a perovskite-type oxide phase. In Examples 5, 8 and 11, on the other hand, it was confirmed to be present in a bixbite-type oxide phase.

The generated phases of the oxide transparent conductive films of Examples 2 to 13 were then measured in the same manner as Example 1. As a result, only a bixbite-type oxide phase was detected for all of the oxide transparent conductive films. That is, the oxide transparent conductive films of Examples 1 to 13 were each composed of a bixbite-type oxide phase.

Evaluations of the oxide sintered compacts and oxide transparent conductive films of Examples 2 to 13 were carried out by the methods described above under "Evaluation of oxide sintered compact" and "Evaluation of oxide transparent conductive film". The evaluation results are summarized in Tables 1 and 2.

Examples 14 to 18

Calcined powders were obtained in the same manner as Example 1. An oxide sintered compact and oxide transparent conductive film for Example 14 were fabricated in the same manner as Example 1, except that the amounts of the indium oxide powder and the tin oxide powder added to the calcined powder were varied as shown in the "Final powder composition" column in Table 1, and the firing temperature was changed from 1500° C. to 1400° C.

An oxide sintered compact and oxide transparent conductive film for Example 15 were fabricated in the same manner as Example 1, except that the amounts of the indium oxide powder and the tin oxide powder added to the calcined powder were varied as shown in the "Final powder composition" column in Table 1, and the firing temperature was changed from 1500° C. to 1350° C.

An oxide sintered compact and an oxide transparent conductive film for Example 16 were fabricated in the same manner as Example 1, except that the amounts of the indium oxide powder and the tin oxide powder added to the calcined powder were varied as shown in the "Final powder composition" column in Table 1, and the firing time at the firing temperature was changed from 5 hours to 10 hours.

An oxide sintered compact and an oxide transparent conductive film for Example 17 were fabricated in the same manner as Example 1, except that the amounts of the indium oxide powder and the tin oxide powder added to the calcined powder were varied as shown in the "Final powder composition" column in Table 1, and the firing temperature was changed from 1500° C. to 1600° C.

Calcined powders were obtained in the same manner as Example 17. An oxide sintered compact and an oxide transparent conductive film for Example 18 were fabricated in the same manner as Example 17, except that the amounts of the indium oxide powder and the tin oxide powder added to the calcined powder were varied as shown in the "Final powder composition" column in Table 1, and the firing time at the firing temperature was changed from 5 to 10 hours.

The oxide sintered compacts of Examples 14 to 18 were pulverized, and the produced phases were identified in the same manner as Example 1 by an X-ray diffraction test. As a result, in Examples 14 to 18, only diffraction peaks for a bixbite-type oxide phase and perovskite-type oxide phase were detected, while no diffraction peak for a tin oxide phase or a strontium oxide phase was detected.

Analysis was also conducted by SEM and EPMA. As a result, in all of Examples 14 to 18, it was confirmed that strontium formed a compound with tin, and was present in a perovskite-type oxide phase.

The generated phases of the oxide transparent conductive films of Examples 14 to 18 were then measured in the same manner as Example 1. As a result, only a bixbite-type oxide phase was detected for all of the oxide transparent conductive films. That is, the oxide transparent conductive films of Examples 14 to 18 were each composed of a bixbite-type oxide phase.

Evaluations of the oxide sintered compacts and the oxide transparent conductive films of Examples 14 to 18 were carried out by the methods described above under "Evaluation of oxide sintered compact" and "Evaluation of oxide transparent conductive film". The evaluation results are summarized in Tables 1 and 2.

Comparative Example 1

<Fabrication and Evaluation of Oxide Sintered Compact>

The starting powders used were indium oxide powder with a purity of 99.99 mass % and a mean particle size of 0.5 µm, and tin oxide powder with a purity of 99.99 mass % and a mean particle size of 0.5 µm. These were mixed in the prescribed amounts using a dry ball mill, to obtain a mixed powder having the composition shown in the column "Final powder composition" of Table 1. The mean particle size of the mixed powder was 0.2 µm. The obtained mixed powder was subjected to die molding using a die with a diameter of 150 mm at 0.3 ton/cm$^2$ (29.42 MPa), and then CIP molding at 3.0 ton/cm² (294.2 MPa), to obtain a compact. The compact was set in a sintering furnace with a pure oxygen atmosphere, and firing was carried out under the same conditions as Example 1.

The obtained oxide sintered compact was pulverized and the product phase was identified by an X-ray diffraction test in the same manner as Example 1. As a result, there was only detected a diffraction peak attributable to a bixbite-type oxide phase, while no diffraction peak was detected for a tin oxide phase.

<Fabrication and Evaluation of Oxide Transparent Conductive Film>

An oxide transparent conductive film was formed on a substrate in the same manner as Example 1. The generated phases of the oxide transparent conductive film were measured in the same manner as Example 1. As a result, only a bixbite-type oxide phase was detected. That is, the oxide transparent conductive film was composed entirely of a bixbite-type oxide phase.

Evaluations of the oxide sintered compact and oxide transparent conductive film of Comparative Example 1 were carried out by the methods described above under "Evaluation of oxide sintered compact" and "Evaluation of oxide transparent conductive film". The evaluation results are summarized in Tables 1 and 2.

Comparative Examples 2 and 3

Oxide sintered compacts and oxide transparent conductive films for Comparative Examples 2 and 3 were fabricated in the same manner as Comparative Example 1, except that the blending ratio of the indium oxide powder and the tin oxide powder was changed as shown in the "Final powder composition" column in Table 1.

The oxide sintered compacts of Comparative Examples 2 and 3 were pulverized, and the produced phases were identified in the same manner as Example 1 by an X-ray diffraction test. As a result, in Comparative Examples 2 and 3 there were only detected diffraction peaks attributable to a bixbite-type oxide phase, while no diffraction peaks were detected for a tin oxide phase.

The generated phases of the oxide transparent conductive films of Comparative Examples 2 and 3 were then measured in the same manner as Example 1. As a result, only a bixbite-type oxide phase was detected for all of the oxide transparent conductive films. Specifically, the oxide transparent conductive films of Comparative Examples 2 and 3 were each composed of a bixbite-type oxide phase.

Evaluations of the oxide sintered compacts and oxide transparent conductive films of Comparative Examples 2 and 3 were carried out by the methods described above under "Evaluation of oxide sintered compact" and "Evaluation of oxide transparent conductive film", The evaluation results are summarized in Tables 1 and 2.

Comparative Examples 4 to 15

Calcined powders were obtained in the same manner as Example 1. Oxide sintered compacts and oxide transparent conductive films for Comparative Examples 4 to 15 were fabricated in the same manner as Example 1, except that the amounts of the indium oxide powder and the tin oxide powder added to the calcined powder were varied as shown in the "Final powder composition" column in Table 1.

The oxide sintered compacts of Comparative Examples 4 to 15 were pulverized, and the produced phases were identified in the same manner as Example 1 by an X-ray diffraction test. As a result, in Comparative Examples 4 to 7 and 10, only diffraction peaks for a bixbite-type oxide phase were detected, while no diffraction peaks for a tin oxide phase or a strontium oxide phase were detected. On the other hand, in Comparative Examples 8, 9 and 11 to 15, only diffraction peaks for a bixbite-type oxide phase and a perovskite-type oxide phase were detected, while no diffraction peak for a tin oxide phase or a strontium oxide phase was detected.

The oxide sintered compacts of Comparative Examples 4 to 15 were also analyzed by SEM and EPMA. As a result, in Comparative Examples 8, 9 and 11 to 15, it was confirmed that strontium formed compound with tin, and was present in a perovskite-type oxide phase. In Comparative Examples 4 to 7 and 10, it was confirmed that strontium was present in a bixbite-type oxide phase.

Next, the generated phases of the oxide transparent conductive films of Comparative Examples 4 to 15 were measured in the same manner as Example 1. As a result, only a bixbite-type oxide phase was detected for all of the oxide transparent conductive films. Specifically, the oxide transparent conductive films of Comparative Examples 4 to 15 were all composed of a bixbite-type oxide phase.

Evaluations of the oxide sintered compacts and the oxide transparent conductive films of Comparative Examples 4 to 15 were carried out by the methods described above under "Evaluation of oxide sintered compact" and "Evaluation of oxide transparent conductive film". The evaluation results are summarized in Tables 1 and 2.

Comparative Example 16

<Fabrication of Oxide Sintered Compact>

The starting powders used were indium oxide powder with a purity of 99.99 mass % and a mean particle size of 0.5 μm, tin oxide powder with a purity of 99.99 mass % and a mean particle size of 0.5 μm, and strontium carbonate powder with a purity of 99.9 mass % and a mean particle size of 1 μm. The indium oxide powder and the strontium carbonate powder were mixed with a dry ball mill to an atomic ratio of Sr:In=1:2, and calcined in air at 1200° C. for 3 hours. The crystal phase of the obtained calcined powder was $SrIn_2O_4$, and the mean particle size was 2.1 μm.

The indium oxide powder and the tin oxide powder were combined with this calcined powder as shown in the "Final powder composition" column in Table 1, and then a PVA water-soluble solution (PVA addition amount=0.5 wt % with respect to the amount of powder, based on solid weight) was added and mixed therewith using a wet ball mill. The calcined powder obtained after mixing and drying (mean particle size: 1.8 μm) was subjected to CIP molding at 3.0 ton/cm² (294.2 MPa) to fabricate a compact. The compact was heated in air to 600° C. at a temperature-elevating rate of 60° C./hr and held for 10 hours for degreasing of the added PVA. The degreased product was set in a sintering furnace with a pure oxygen atmosphere, and firing was carried out under the following conditions.

(Firing Conditions)

Temperature-elevating rate: 200° C./hr up to 800° C., 400° C./hr from 800° C. to 1550° C.

Firing temperature: 1550° C.

Firing time: 8 hours

Firing atmosphere: Introduction of pure oxygen gas into the furnace from initial temperature elevation (room temperature) until completion of temperature reduction (100° C.).

Temperature-lowering rate: 100° C./hr

<Evaluation of Oxide Sintered Compact>

The obtained oxide sintered compact was pulverized and the product phase was identified by an X-ray diffraction test in the same manner as Example 1. As a result, diffraction peaks were detected for a bixbite-type oxide phase and a spinel-type oxide phase corresponding to $SrIn_2O_4$. However, no diffraction peak was detected for a tin oxide phase or strontium oxide phase. Analysis was also conducted by SEM and EPMA. As a result, it was confirmed that strontium formed a compound with indium, and was present in a spinel-type oxide phase.

<Fabrication of Oxide Transparent Conductive Film>

An oxide transparent conductive film was formed on a substrate by the same method as Example 1. The generated phases of the obtained oxide transparent conductive film were measured in the same manner as Example 1. As a result, only a bixbite-type oxide phase was detected. That is, the oxide transparent conductive film of Comparative Example 16 was composed of a bixbite-type oxide phase.

Evaluations of the oxide sintered compact and oxide transparent conductive film were carried out by the methods described above under "Evaluation of oxide sintered compact" and "Evaluation of oxide transparent conductive film". The evaluation results are summarized in Tables 1 and 2.

Comparative Example 17

Calcined powder was obtained in the same manner as Comparative Example 16. An oxide sintered compact and oxide transparent conductive film for Comparative Example 17 were fabricated in the same manner as Comparative Example 16, except that the amounts of indium oxide powder and tin oxide powder combined with the calcined powder were changed as shown in the "Final powder composition" column in Table 1.

The obtained oxide sintered compact was pulverized and the product phase was identified by an X-ray diffraction test in the same manner as Example 1. As a result, diffraction peaks were detected for a bixbite-type oxide phase, a perovskite-type oxide phase and a spinel-type oxide phase corresponding to $SrIn_2O_4$. However, no diffraction peak was detected for a tin oxide phase or a strontium oxide phase.

Analysis was also conducted by SEM and EPMA. As a result, it was confirmed that strontium formed compounds with indium and tin, and was present in a perovskite-type oxide phase and a spinel-type oxide phase.

The generated phases of the oxide transparent conductive film were measured in the same manner as Example 1. As a result, only a bixbite-type oxide phase was detected. That is, the oxide transparent conductive film was composed of a bixbite-type oxide phase.

Evaluation of the oxide sintered compact and oxide transparent conductive film was carried out by the methods described above under "Evaluation of oxide sintered compact" and "Evaluation of oxide transparent conductive film". The evaluation results are summarized in Tables 1 and 2.

Comparative Example 18

An oxide sintered compact and an oxide transparent conductive film for Comparative Example 18 were fabricated in the same manner as Example 1, except that the amounts of the indium oxide powder and the tin oxide powder combined with the calcined powder obtained in the same manner as Example 1 were varied as shown in the "Final powder composition" column in Table 1, and the firing temperature was changed from 1500° C. to 1300° C.

The fabricated oxide sintered compact was pulverized and the product phase was identified by an X-ray diffraction test in the same manner as Example 1. As a result, only diffraction peaks for a bixbite-type oxide phase and perovskite-type oxide phase were detected, while no diffraction peak for a tin oxide phase or strontium oxide phase was detected.

Analysis was also conducted by SEM and EPMA. As a result, it was confirmed that strontium formed a compound with tin, and was present in a perovskite-type oxide phase.

The generated phases of the fabricated oxide transparent conductive film, were measured in the same manner as Example 1. As a result, only a bixbite-type oxide phase was detected. That is, the oxide transparent conductive film of Comparative Example 18 was composed of a bixbite-type oxide phase.

Evaluations of the oxide sintered compact and oxide transparent conductive film were carried out by the methods described above under "Evaluation of oxide sintered compact" and "Evaluation of oxide transparent conductive film". The evaluation results are summarized in Tables 1 and 2.

TABLE 1

| | Final composition of powder (=composition of sintered material) [content (atom %) ratio] | | | Crystal phase (X-ray diffraction) | | | Relative density (%) | Mean particle size of perovskite-type oxide (μm) |
|---|---|---|---|---|---|---|---|---|
| | In/ (In + Sn + Sr) | Sn/ (In + Sn + Sr) | Sr/ (In + Sn + Sr) | Bixbite structure | Perovskite structure | Other crystal phases | | |
| Example 1 | 0.9235 | 0.076 | 0.0005 | A | B | B | 99.7 | — |
| Example 2 | 0.923 | 0.076 | 0.001 | A | A | B | 99.7 | 1.9 |
| Example 3 | 0.922 | 0.076 | 0.002 | A | A | B | 99.6 | 2.5 |
| Example 4 | 0.92 | 0.076 | 0.004 | A | A | B | 99.6 | 2.5 |
| Example 5 | 0.9615 | 0.038 | 0.0005 | A | B | B | 99.7 | — |
| Example 6 | 0.96 | 0.038 | 0.002 | A | A | B | 99.6 | 2.9 |
| Example 7 | 0.958 | 0.038 | 0.004 | A | A | B | 99.7 | 2.8 |
| Example 8 | 0.9875 | 0.012 | 0.0005 | A | B | B | 99.6 | — |
| Example 9 | 0.986 | 0.012 | 0.002 | A | A | B | 99.7 | 3.5 |
| Example 10 | 0.984 | 0.012 | 0.004 | A | A | B | 99.6 | 3.4 |
| Example 11 | 0.8895 | 0.11 | 0.0005 | A | B | B | 99.5 | — |
| Example 12 | 0.888 | 0.11 | 0.002 | A | A | B | 99.6 | 3.6 |
| Example 13 | 0.886 | 0.11 | 0.004 | A | A | B | 99.6 | 3.6 |
| Example 14 | 0.92 | 0.076 | 0.004 | A | A | B | 99.4 | 2.0 |
| Example 15 | 0.92 | 0.076 | 0.004 | A | A | B | 97.3 | 1.8 |

TABLE 1-continued

| | Final composition of powder (=composition of sintered material) [content (atom %) ratio] | | | Crystal phase (X-ray diffraction) | | | Relative density (%) | Mean particle size of perovskite-type oxide (μm) |
|---|---|---|---|---|---|---|---|---|
| | In/ (In + Sn + Sr) | Sn/ (In + Sn + Sr) | Sr/ (In + Sn + Sr) | Bixbite structure | Perovskite structure | Other crystal phases | | |
| Example 16 | 0.922 | 0.076 | 0.002 | A | A | B | 99.6 | 4.8 |
| Example 17 | 0.922 | 0.076 | 0.002 | A | A | B | 99.6 | 5.2 |
| Example 18 | 0.922 | 0.076 | 0.002 | A | A | B | 99.7 | 6.1 |
| Comp. Ex. 1 | 0.924 | 0.076 | 0 | A | B | B | 99.7 | — |
| Comp. Ex. 2 | 0.962 | 0.038 | 0 | A | B | B | 99.6 | — |
| Comp. Ex. 3 | 0.988 | 0.012 | 0 | A | B | B | 99.4 | — |
| Comp. Ex. 4 | 0.9237 | 0.076 | 0.0003 | A | B | B | 99.6 | — |
| Comp. Ex. 5 | 0.9617 | 0.038 | 0.0003 | A | B | B | 99.7 | — |
| Comp. Ex. 6 | 0.9877 | 0.012 | 0.0003 | A | B | B | 99.5 | — |
| Comp. Ex. 7 | 0.9915 | 0.008 | 0.0005 | A | B | B | 99.6 | — |
| Comp. Ex. 8 | 0.99 | 0.008 | 0.002 | A | A | B | 99.5 | 2.7 |
| Comp. Ex. 9 | 0.988 | 0.008 | 0.004 | A | A | B | 99.6 | 2.4 |
| Comp. Ex. 10 | 0.8695 | 0.13 | 0.0005 | A | B | B | 99.7 | — |
| Comp. Ex. 11 | 0.868 | 0.13 | 0.002 | A | A | B | 99.7 | 4.1 |
| Comp. Ex. 12 | 0.866 | 0.13 | 0.004 | A | A | B | 99.6 | 3.5 |
| Comp. Ex. 13 | 0.918 | 0.076 | 0.006 | A | A | B | 99.7 | 2.7 |
| Comp. Ex. 14 | 0.956 | 0.038 | 0.006 | A | A | B | 99.7 | 3.1 |
| Comp. Ex. 15 | 0.982 | 0.012 | 0.006 | A | A | B | 99.6 | 3.0 |
| Comp. Ex. 16 | 0.922 | 0.076 | 0.002 | A | B | A | 99.7 | — |
| Comp. Ex. 17 | 0.92 | 0.076 | 0.004 | A | A | A | 99.7 | 3.1 |
| Comp. Ex. 18 | 0.92 | 0.076 | 0.004 | A | A | B | 96.2 | 1.8 |

TABLE 2

| | Discharge characteristic (times/hr) | Film-forming atmosphere (Oxygen volume ratio) | Resistivity (μΩcm) | Transmittance (%) | | Reliability (%) |
|---|---|---|---|---|---|---|
| | | | | Visible region (400-800 nm) | Infrared region (800-1200 nm) | |
| Example 1 | 1.4 | 0.005 | 226 | 92.8 | 87.9 | 2.3 |
| Example 2 | 1.4 | 0.005 | 230 | 92.9 | 90.4 | 1.9 |
| Example 3 | 1.2 | 0.005 | 237 | 93.6 | 90.7 | 1.8 |
| Example 4 | 1.6 | 0.006 | 255 | 92.8 | 90.6 | 1.8 |
| Example 5 | 1.5 | 0.005 | 229 | 92.2 | 89.5 | 11.6 |
| Example 6 | 1.4 | 0.005 | 235 | 93.4 | 93.0 | 10.3 |
| Example 7 | 1.8 | 0.006 | 268 | 93.2 | 93.1 | 9.8 |
| Example 8 | 1.5 | 0.003 | 241 | 91.6 | 89.6 | 16.7 |
| Example 9 | 2.0 | 0.003 | 254 | 91.8 | 90.5 | 14.6 |
| Example 10 | 1.7 | 0.003 | 273 | 91.8 | 90.4 | 14.2 |
| Example 11 | 1.8 | 0.005 | 262 | 93.8 | 86.8 | 1.1 |
| Example 12 | 2.0 | 0.005 | 266 | 93.3 | 90.1 | 1.2 |
| Example 13 | 1.9 | 0.005 | 271 | 93.5 | 90.5 | 1.1 |
| Example 14 | 2.1 | 0.007 | 256 | 92.7 | 90.6 | 1.9 |
| Example 15 | 2.3 | 0.007 | 252 | 92.8 | 90.6 | 1.8 |
| Example 16 | 1.9 | 0.005 | 238 | 93.5 | 90.4 | 1.9 |
| Example 17 | 2.4 | 0.005 | 236 | 93.1 | 90.6 | 2.2 |
| Example 18 | 2.5 | 0.005 | 240 | 93.3 | 90.4 | 2.0 |
| Comp. Ex. 1 | 1.8 | 0.005 | 227 | 91.1 | 78.9 | 7.9 |
| Comp. Ex. 2 | 2.1 | 0.005 | 232 | 89.3 | 91.4 | 110.8 |
| Comp. Ex. 3 | 2.5 | 0.005 | 250 | 85.8 | 90.7 | 184.2 |
| Comp. Ex. 4 | 1.7 | 0.005 | 231 | 91.2 | 79.1 | 8.0 |
| Comp. Ex. 5 | 1.6 | 0.005 | 235 | 88.7 | 91.2 | 101.2 |
| Comp. Ex. 6 | 1.8 | 0.003 | 252 | 86.2 | 90.8 | 158.3 |
| Comp. Ex. 7 | 1.6 | 0.003 | 428 | 85.8 | 89.6 | 120.7 |
| Comp. Ex. 8 | 2.0 | 0.003 | 475 | 85.6 | 90.6 | 118.5 |
| Comp. Ex. 9 | 1.9 | 0.003 | 517 | 85.6 | 91.1 | 103.7 |
| Comp. Ex. 10 | 2.2 | 0.005 | 208 | 92.1 | 75.3 | 1.3 |
| Comp. Ex. 11 | 2.5 | 0.005 | 224 | 92 | 76.2 | 1.1 |
| Comp. Ex. 12 | 2.3 | 0.005 | 231 | 91.8 | 76.8 | 1.4 |
| Comp. EX. 13 | 2.5 | 0.006 | 583 | 93.2 | 90.4 | 1.9 |
| Comp. Ex. 14 | 2.3 | 0.006 | 596 | 91.6 | 90.5 | 71.3 |
| Comp. Ex. 15 | 2.2 | 0.003 | 607 | 90.1 | 90.8 | 84.3 |
| Comp. Ex. 16 | 5.5 | 0.005 | 238 | 93.4 | 90.5 | 2.1 |
| Comp. Ex. 17 | 5.0 | 0.007 | 241 | 93.1 | 90.5 | 2.3 |
| Comp. Ex. 18 | 5.5 | 0.007 | 254 | 92.6 | 90.6 | 1.9 |

Based on comparison between Examples 1 to 18 and Comparative Examples 1 to 15, it is concluded that oxide transparent conductive films with excellent resistivity, infrared region transmittance and reliability were obtained in Examples 1 to 18. Based on comparison of Examples 3 and 4 and Comparative Examples 16 and 17, it is concluded that anomalous discharge during film formation was adequately suppressed in Examples 3 and 4.

Based on comparison of Examples 4, 14 and 15 and Comparative Example 18, it is concluded that anomalous discharge during film formation was adequately suppressed in Examples 4, 14 and 15. Of these, anomalous discharge during film formation was especially suppressed in Example 4. When Examples 3, 17 and 18 are compared, Example 3 is found to have particularly suppressed anomalous discharge during film formation.

Examples 19 to 28

Comparative Examples 19 to 28

<Fabrication of Solar Cells>

Solar cells such as shown in FIG. 2 were fabricated for Examples 19 to 28 and Comparative Examples 19 to 28, by the following procedure.

First, a commercially available Mo electrode-bearing glass substrate comprising a Mo electrode (600 nm) formed on a soda lime glass substrate (1 mm) was prepared as the substrate 10 and back side metal electrode 20. On this back side metal electrode 20 there was formed a compound semiconductor with a p-type chalcopyrite-type structure as a CIGS layer (1500 nm) (photoelectric conversion layer 30), by RF magnetron sputtering using a commercially available $CuIn_{0.8}Ga_{0.2}Se_2$ (CIGS) target. The substrate temperature was 500° C.

On the photoelectric conversion layer 30 consisting of the compound semiconductor there was formed, as the buffer layer 40, a $Zn_{0.8}Mg_{0.2}O$ (100 nm) n-type buffer layer by RF magnetron sputtering. The substrate temperature was 200° C.

Next, on the buffer layer 40 there was formed an oxide transparent conductive film (transparent electrode 50) by the method described below under "Fabrication of transparent conductive film" (150 nm). The back side metal electrode 20 was then exposed to form a positive electrode on a portion of the back side metal electrode. Also, on a portion of the oxide transparent conductive film (transparent electrode 50) there was formed a front side metal electrode 60 composed of an Al layer (100 nm), by vacuum vapor deposition, and this was used as the negative electrode.

The procedure described above was used to fabricate a substrate-type chalcopyrite-type solar cell 100 in which light impinged from the oxide transparent conductive film side.

<Fabrication of Transparent Conductive Film>

The transparent conductive film 50 was used for film formation by magnetron sputtering using a sputtering target with a relative density of ≥99%. The composition and properties of the oxide transparent conductive film were as shown in Table 3. The sputtering target was fabricated by the following procedure.

First, the following starting powders were prepared. The physical properties of the starting powders used were as follows.

Indium oxide powder: 99.99 mass % purity, 0.5 μm mean particle size

Tin oxide powder: 99.99 mass % purity, 0.5 μm mean particle size

Strontium carbonate powder: 99.9 mass % purity, 1 μm mean particle size

The mean particle size of each starting powder was measured using a COULTER LS130 (trade name of Coulter Electronics), with a liquid module in distilled water. The measured value is based on volume.

Prescribed amounts of tin oxide powder and strontium carbonate were mixed with a dry ball mill to prepare a mixed powder. The mixed powder was calcined in air at 1000° C. for 2 hours and then treated with a dry ball mill to obtain a calcined powder with a mean particle size of 0.2 μm. The indium oxide powder and the tin oxide powder were combined with the obtained calcined powder to the compositions listed in the "Final powder composition" column in Table 3 and mixed with a dry ball mill. The mean particle size of the mixed powder was 0.2 μm. The obtained powder was subjected to CIP molding at 3.0 ton/cm² (294.2 MPa) to fabricate a compact. The compact was set in a sintering furnace with a pure oxygen atmosphere, and firing was carried out under the following conditions.

(Firing Conditions)

Temperature-elevating rate: 50° C./hr

Firing temperature: 1600° C. for Examples 19 to 21 and 26 and Comparative Examples 19, 23 and 27

1500° C. for Examples 22 to 25, 27 and 28 and Comparative Examples 20 to 22, 24 to 26 and 28

Firing time: 5 hours

Firing atmosphere: Introduction of pure oxygen gas into the furnace from initial temperature elevation (room temperature) until completion of temperature reduction (100° C.).

Temperature-lowering rate: 100° C./hr

The sintered complex oxide obtained in this manner was worked to a size of 4-inchφ (diameter: 102 mm), to fabricate a sputtering target. The sputtering surface of the sputtering target had its center line average roughness adjusted using a surface grinding machine and a diamond grinding stone, changing the number of the grinding stone.

The obtained sputtering target was used for film formation on a substrate by DC magnetron sputtering under the following conditions. The sample having the film formed on the substrate was then subjected to heat treatment with heating at 200° C. for 1 hour. An oxide transparent conductive film was thus obtained.

(Sputtering Film Formation Conditions)

Apparatus: DC magnetron sputtering apparatus

Magnetic field intensity: 1000 Gauss (directly above target, horizontal component)

Substrate temperature: Room temperature (approximately 25° C.)

Ultimate vacuum: $5 \times 10^{-5}$ Pa

Sputtering gas: argon+oxygen

[Oxygen ratio (by volume)=oxygen/(argon+oxygen)= 0.005]

Sputtering gas pressure: 0.5 Pa

DC power: 200W

Film thickness: 150 nm (Post-Film Formation Treatment Conditions)

The sample with the film formed on the substrate was subjected to heat treatment under conditions of 200° C., 1 hour.

<Properties of Oxide Transparent Conductive Film>

Non-alkaline glass (#1737 Glass, product of Corning, Inc.) with a thickness of 0.7 mm was prepared. An oxide transparent conductive film was directly formed on the substrate under the "Sputtering film formation conditions" described above, and was heat treated under the "Post-film formation treatment conditions" described above. Evaluation of the oxide transparent conductive films of Examples 19 to 28 and Comparative Examples 19 to 28 obtained as explained above was carried out in the following manner. The evaluation results were as shown in Table 3. The generated phases of the oxide transparent conductive films of Examples 19 to 28 and Comparative Examples 19 to 28 were measured by an X-ray diffraction test, and the results indicate that all were composed of a crystalline bixbite-type indium oxide phase alone.

85%, and the change in resistivity was observed. Defining the resistivity before and after the test as A and B respectively, the value of (B−A)/A in % units was recorded as the index of reliability (durability). The values (reliability) are shown in Table 3. Generally speaking, this value tends to increase with a longer test time, with smaller values indicating more excellent heat resistance and humidity resistance.

(Resistivity of Oxide Transparent Conductive Film)

The resistivity of the thin-film was measured using an HL5500 (trade name of Japan Bio-Rad Laboratories, Inc.).

TABLE 3

|  | Composition [content (atom %) ratio] | | | Resistivity ($\mu\Omega$cm) | Transmittance (%) | | Reliability (%) |
|---|---|---|---|---|---|---|---|
|  | In/ (In + Sn + Sr) | Sn/ (In + Sn + Sr) | Sr/ (In + Sn + Sr) |  | Visible region (400-800 nm) | Infrared region (800-1200 nm) |  |
| Example 19 | 0.9235 | 0.076 | 0.0005 | 226 | 92.8 | 87.9 | 2.3 |
| Example 20 | 0.923 | 0.076 | 0.001 | 230 | 92.9 | 90.4 | 1.9 |
| Example 21 | 0.922 | 0.076 | 0.002 | 237 | 93.6 | 90.7 | 1.8 |
| Example 22 | 0.92 | 0.076 | 0.004 | 255 | 92.8 | 90.6 | 1.8 |
| Example 23 | 0.9615 | 0.038 | 0.0005 | 229 | 92.2 | 89.5 | 11.6 |
| Example 24 | 0.961 | 0.038 | 0.001 | 231 | 92.8 | 92.9 | 9.6 |
| Example 25 | 0.96 | 0.038 | 0.002 | 235 | 93.4 | 93.0 | 10.3 |
| Example 26 | 0.958 | 0.038 | 0.004 | 268 | 93.2 | 93.1 | 9.8 |
| Example 27 | 0.986 | 0.012 | 0.002 | 254 | 91.8 | 90.5 | 14.6 |
| Example 28 | 0.888 | 0.11 | 0.002 | 266 | 93.3 | 90.1 | 1.2 |
| Comp. Ex. 19 | 0.924 | 0.076 | 0 | 227 | 91.4 | 78.9 | 7.9 |
| Comp. Ex. 20 | 0.962 | 0.038 | 0 | 232 | 89.3 | 91.4 | 110.8 |
| Comp. Ex. 21 | 0.988 | 0.012 | 0 | 250 | 85.8 | 90.7 | 184.2 |
| Comp. Ex. 22 | 0.89 | 0.11 | 0 | 248 | 91.6 | 76.6 | 7.8 |
| Comp. Ex. 23 | 0.9237 | 0.076 | 0.0003 | 231 | 91.2 | 79.1 | 8.0 |
| Comp. Ex. 24 | 0.9617 | 0.038 | 0.0003 | 235 | 88.7 | 91.2 | 101.2 |
| Comp. Ex. 25 | 0.9877 | 0.012 | 0.0003 | 252 | 86.2 | 90.8 | 158.3 |
| Comp. Ex. 26 | 0.99 | 0.008 | 0.002 | 475 | 85.6 | 90.6 | 118.5 |
| Comp. Ex. 27 | 0.868 | 0.13 | 0.002 | 224 | 92 | 76.2 | 1.1 |
| Comp. Ex. 28 | 0.956 | 0.038 | 0.006 | 596 | 91.6 | 90.5 | 71.3 |

(Composition of Oxide Transparent Conductive Film)

An ICP emission spectroscopic analyzer (product of Seiko Instruments, Inc.) was used for quantitation by ICP emission spectroscopy.

(X-Ray Diffraction Test of Oxide Transparent Conductive Film)

The measuring conditions were as follows.
X-ray source: CuKα
Power: 40 kV, 40 mA
Scanning rate: 1°/min (Transmittance of Oxide Transparent Conductive Film)

The light transmittance of the integrated body of the substrate and oxide transparent conductive film was measured using a U-4100 spectrophotometer (product of Hitachi, Ltd.), at a wavelength in the range of 240 nm to 2600 nm. The transmittance of the oxide transparent conductive film itself was determined by the following formula. The values were as listed in Table 3.

((Transmittance of the integrated body of the substrate and the oxide transparent conductive film)/(transmittance of substrate alone))×100(%)

The mean value of the transmittance between a wavelength of 400 nm to 800 nm was recorded as the transmittance in the visible light region, and the mean value of the transmittance between a wavelength of 800 nm and 1200 nm was recorded as the transmittance in the infrared region.

(Reliability of Oxide Transparent Conductive Film)

The thin-film sample was continuously exposed to an environment at a temperature of 85° C. and a relative humidity of <Evaluation of Solar Cell>

Evaluation of the solar cells of Examples 19 to 28 and Comparative Examples 19 to 28 fabricated as described above was carried out according to the following procedure. The current-voltage characteristic was measured while irradiating light of AM1.5 (100 mW/cm$^2$) onto the solar cell with a solar simulator. The short-circuit current, open voltage, fill factor and photoelectric conversion efficiency were evaluated in this manner, and a relative comparison was made.

During the photoirradiation, the current at the moment of short-circuit between the electrodes was recorded as the short-circuit current, the output voltage at the opening point of both electrodes was recorded as the open voltage, and the value of the short-circuit current divided by the effective active area was recorded as the short-circuit current density. The product of the short-circuit current and the open voltage is the ideal electric power value output of the solar cell. The ratio of the actual electric power output with respect to the electric power value is expressed as the fill factor (FF). Therefore, larger values for the short-circuit current, open voltage, fill factor and photoelectric conversion efficiency indicate that the solar cell has more excellent characteristics.

Each of the measurement results in examples and comparative examples are shown in Table 4 as relative values with respect to 1.00 as the value obtained for the solar cell of Comparative Example 20. Comparative Example 20 was a conventionally employed film formed using an indium oxide target with tin oxide added at 5 mass %.

TABLE 4

| | Solar cell characteristics | | | |
|---|---|---|---|---|
| | Short-circuit current Isc | Open-circuit voltage Voc | Fill factor FF | Conversion efficiency η |
| Example 19 | 0.97 | 1.05 | 1.03 | 1.06 |
| Example 20 | 1.02 | 1.12 | 1.01 | 1.16 |
| Example 21 | 1.01 | 1.16 | 1.00 | 1.18 |
| Example 22 | 0.99 | 1.18 | 1.00 | 1.15 |
| Example 23 | 1.02 | 1.07 | 1.02 | 1.13 |
| Example 24 | 1.04 | 1.20 | 1.00 | 1.23 |
| Example 25 | 1.04 | 1.26 | 0.99 | 1.29 |
| Example 26 | 1.03 | 1.21 | 1.00 | 1.22 |
| Example 27 | 1.02 | 1.09 | 1.00 | 1.11 |
| Example 28 | 0.99 | 1.10 | 1.00 | 1.10 |
| Comp. Ex. 19 | 0.90 | 1.01 | 1.00 | 0.91 |
| Comp. Ex. 20 | 1.00 | 1.00 | 1.00 | 1.00 |
| Comp. Ex. 21 | 0.96 | 1.02 | 1.00 | 0.98 |
| Comp. Ex. 22 | 0.84 | 0.98 | 1.02 | 0.86 |
| Comp. Ex. 23 | 0.91 | 1.02 | 0.97 | 0.90 |
| Comp. Ex. 24 | 0.99 | 1.02 | 0.98 | 1.00 |
| Comp. Ex. 25 | 0.97 | 1.01 | 1.00 | 0.98 |
| Comp. Ex. 26 | 0.95 | 1.04 | 0.96 | 0.96 |
| Comp. Ex. 27 | 0.87 | 1.04 | 0.99 | 0.91 |
| Comp. Ex. 28 | 1.01 | 1.02 | 0.97 | 1.00 |

These results confirmed that a solar cell of the invention can yield high conversion efficiency compared to a conventional solar cell.

INDUSTRIAL APPLICABILITY

According to the invention there is provided an oxide sintered compact that can be suitably used as a sputtering target. By using the sputtering target for sputtering, it is possible to produce an oxide transparent conductive film while minimizing anomalous discharge during sputtering. The oxide transparent conductive film has excellent optical transparency in the visible light region and the infrared region, and excellent durability. Therefore, when it is used in a solar cell, for example, it can utilize sunlight energy in the infrared region in a highly efficient manner, which has not been possible in the prior art. It is therefore possible to provide a solar cell with high photoelectric conversion efficiency.

EXPLANATION OF SYMBOLS

2: Oxide sintered compact, 10: substrate, 20: back side metal electrode, 30: photoelectric conversion layer (compound semiconductor with p-type chalcopyrite-type structure), 40: buffer layer, 50: transparent conductive film, 60: front side metal electrode, 100: solar cell.

The invention claimed is:

1. An oxide sintered compact composed of a crystal phase which consists of a bixbite-type oxide phase and a perovskite-type oxide phase, or a bixbite-type oxide phase,
the crystal phase having indium, tin, strontium and oxygen as the constituent elements, and
the indium, the tin and the strontium contents satisfying the following formulas (1) and (2) in terms of atomic ratio:

$$Sn/(In+Sn+Sr)=0.01\text{-}0.11 \quad (1)$$

$$Sr/(In+Sn+Sr)=0.0005\text{-}0.004 \quad (2),$$

wherein in formulae (1) and (2), In, Sn and Sr represent indium, tin and strontium contents (atomic percent), respectively and
wherein the oxide sintered compact has a relative density of 97% or greater.

2. The oxide sintered compact according to claim 1, which is composed of the crystal phase which consists of the bixbite-type oxide phase and the perovskite-type oxide phase,
both the bixbite-type oxide phase and the perovskite-type oxide phase containing indium, tin, strontium and oxygen as constituent elements, and
wherein the oxide sintered compact contains no tin oxide phase or strontium oxide phase.

3. The oxide sintered compact according to claim 1, wherein strontium is present only in the perovskite-type oxide phase.

4. The oxide sintered compact according claim 1, wherein the mean particle size of the perovskite-type oxide phase is no greater than 5 μm.

5. A sputtering target comprising an oxide sintered compact according to claim 1.

6. A method for manufacturing an oxide transparent conductive film, comprising a step of sputtering using a sputtering target according to claim 5.

7. A method for manufacturing an oxide sintered compact comprising:
pre-mixing a strontium-containing powder and a tin-containing powder to prepare a first mixed powder in which the strontium and the tin satisfy formula (3) in terms of atomic ratio,
calcining the first mixed powder at 800° C. to 1200° C. to adjust the mean particle size to no greater than 0.5 μm, to obtain calcined powder,
mixing the calcined powder with indium oxide powder and tin oxide powder to prepare a second mixed powder in which indium, tin and strontium satisfy formulas (1) and (2) in terms of atomic ratio, and
molding and firing the second mixed powder to obtain an oxide sintered compact according to claim 1, wherein $$Sn/(In+Sn+Sr)=0.01\text{-}0.11 \quad (1)$$

$$Sr/(In+Sn+Sr)=0.0005\text{-}0.004 \quad (2)$$

$$Sn/(Sn+Sr)=0.4\text{-}0.6 \quad (3);$$

and wherein in formulae (1) and (2), In, Sn and Sr represent indium, tin and strontium contents (atomic percent), respectively.

* * * * *